US012604704B2

(12) United States Patent (10) Patent No.: US 12,604,704 B2
Sugiura et al. (45) Date of Patent: Apr. 14, 2026

(54) WAFER TRANSFER METHOD AND WAFER TRANSFER APPARATUS

(71) Applicant: DISCO CORPORATION, Tokyo (JP)

(72) Inventors: Kazuki Sugiura, Tokyo (JP); Takashi Mori, Tokyo (JP); Yoshinori Kakinuma, Tokyo (JP); Tetsuya Hosono, Tokyo (JP); Kaoru Amano, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 550 days.

(21) Appl. No.: 18/169,282

(22) Filed: Feb. 15, 2023

(65) Prior Publication Data

US 2023/0268220 A1 Aug. 24, 2023

(30) Foreign Application Priority Data

Feb. 18, 2022 (JP) ................................ 2022-023417

(51) Int. Cl.
*H10P 72/70* (2026.01)
*H10D 84/01* (2026.01)
*H10P 70/00* (2026.01)
*H10P 72/00* (2026.01)

(52) U.S. Cl.
CPC ......... *H10P 72/7402* (2026.01); *H10D 84/01* (2025.01); *H10P 70/23* (2026.01); *H10P 72/0404* (2026.01); *H10P 72/0442* (2026.01); *H10P 72/7412* (2026.01); *H10P 72/7442* (2026.01)

(58) Field of Classification Search
CPC ........... H01L 21/0206; H01L 21/67023; H01L 21/67092; H01L 21/67132; H01L 21/677; H01L 21/67742; H01L 21/67766; H01L 21/683; H01L 21/6836; H01L 21/68707; H01L 21/77; H01L 2221/68318; H01L 2221/68327; H01L 2221/68386
See application file for complete search history.

(56) References Cited

U.S. PATENT DOCUMENTS

2007/0181245 A1* 8/2007 Kaneshima ............. B29C 63/02
156/499
2007/0227655 A1* 10/2007 Kajiyama ............... H10P 54/00
438/690
2023/0268220 A1* 8/2023 Sugiura ............... H10P 72/0442
438/464

FOREIGN PATENT DOCUMENTS

JP 2007173770 A 7/2007
JP 2010082644 A 4/2010
JP 2012244013 A 12/2012
JP 2017112337 A 6/2017
(Continued)

OTHER PUBLICATIONS

Translation of KR20130127920.*
(Continued)

*Primary Examiner* — Sonya M Sengupta
(74) *Attorney, Agent, or Firm* — Greer Burns & Crain Ltd.

(57) ABSTRACT

A wafer transfer method for forming a second work unit by transferring a wafer of a first work unit including a first ring frame, a first adhesive tape, and the wafer to a second adhesive tape includes sandwiching a claw body between the first ring frame and a second ring frame, affixing the second adhesive tape to a surface of the wafer which surface is not affixed to the first adhesive tape, holding the wafer by the second ring frame via the second adhesive tape, and peeling off the first adhesive tape from the wafer.

10 Claims, 14 Drawing Sheets

(56)     References Cited

FOREIGN PATENT DOCUMENTS

| JP | 2017162870 A | 9/2017 |
| JP | 2021097068 A | 6/2021 |

OTHER PUBLICATIONS

Translation of JP2005109157.*
Translation of JP2005317711.*
Translation of JP2006100728.*
Translation of WO2006057376.*
Translation of CN109427632 (Year: 2019).*
Office Action issued in counterpart Japanese patent application No. 2022-023417, dated Sep. 16, 2025.

* cited by examiner

WAFER TRANSFER METHOD AND WAFER TRANSFER APPARATUS

BACKGROUND OF THE INVENTION

Field of the Invention

The present invention relates to a wafer transfer method that affixes a wafer affixed to a first adhesive tape to a second adhesive tape and that peels off the first adhesive tape from the wafer and a wafer transfer apparatus that transfers the wafer from the first adhesive tape to the second adhesive tape.

Description of the Related Art

In a process of manufacturing device chips used in electronic apparatuses such as mobile telephones or personal computers, first, a plurality of planned dividing lines (streets) intersecting one another are set on the top surface of a wafer formed of a material such as a semiconductor. Then, a device such as an integrated circuit (IC) or large-scale integration (LSI) is formed in each of regions demarcated by the planned dividing lines. The individual device chips are formed when the wafer is thereafter divided along the planned dividing lines. The division of the wafer is, for example, performed by a cutting apparatus having an annular cutting blade. Before the wafer is loaded into the cutting apparatus, an adhesive tape having a diameter larger than that of the wafer is affixed to the undersurface of the wafer. This adhesive tape is referred to as a dicing tape. An inner circumferential portion of a ring frame having an opening portion of such a size as to be able to house the wafer is affixed to a peripheral portion of the adhesive tape. That is, the wafer, the adhesive tape, and the ring frame are integrated to form a frame unit, and the wafer forming a part of the frame unit and having the top surface side thereof exposed upward is loaded into the cutting apparatus and processed therein.

In the cutting apparatus, while a workpiece is cut, cutting water is supplied to the workpiece and the cutting blade in order to remove heat and cutting waste generated from the workpiece and the cutting blade by the cutting. However, when the cutting water that has captured the cutting waste comes into contact with the top surface of the workpiece and the cutting water is dried, the cutting waste is fixed to the devices formed on the top surface of the workpiece. Accordingly, there is a case where, in order not to contaminate the top surface side, the frame unit is formed by affixing the adhesive tape to the top surface side in place of the undersurface of the wafer, to expose the undersurface side upward (see Japanese Patent Laid-Open No. 2010-82644).

However, in this case, each chip formed by cutting the wafer has a device formation surface thereof oriented to the adhesive tape side. Therefore, when the chip is picked up from the adhesive tape and mounted on a predetermined mounting target, the circuit pattern of the device cannot be photographed by an imaging unit, and the alignment of the chip in consideration of the position of the circuit pattern cannot be performed. Accordingly, after the wafer is cut, performed is transfer work (reaffixing work) which affixes a new adhesive tape to the exposed undersurface side of the wafer and peels off the old adhesive tape from the wafer (see Japanese Patent Laid-Open No. 2017-162870). More specifically, first, a first adhesive tape of a first frame unit including the wafer, the first adhesive tape, and a first ring frame is cut along the periphery of the wafer. Then, in place of the first ring frame, a second ring frame is disposed on the periphery of the wafer, and a second adhesive tape is affixed to the surface of the wafer to which surface the first adhesive tape is not affixed and the second ring frame. Finally, the first adhesive tape remaining on the wafer is peeled off. The transfer of the wafer (reaffixing of the adhesive tape) is thereby completed.

SUMMARY OF THE INVENTION

However, in a case where the wafer transfer work is performed by this method, there is a fear that a cutting tool cutting the first adhesive tape may come into contact with the wafer and damage the wafer (chips). In addition, there is a fear that cutting waste may be generated by cutting the first adhesive tape, adhere to the wafer, and contaminate the wafer. The wafer has been subjected to various kinds of processing with enormous cost and time before this stage in which the transfer work is performed. Therefore, damaging or soiling the wafer (chips) in this stage immediately before the completion of the chips causes a tremendous loss. Hence, there is a desire to perform the wafer transfer work (reaffixing of the adhesive tape) without cutting the adhesive tape.

It is accordingly an object of the present invention to provide a wafer transfer method and a wafer transfer apparatus that can transfer a wafer safely by replacing an adhesive tape without cutting the adhesive tape.

In accordance with an aspect of the present invention, there is provided a wafer transfer method for forming a second work unit by transferring a wafer of a first work unit to a second adhesive tape that is affixed to a second ring frame in such a manner as to close a second opening portion disposed in a center of the second ring frame, the first work unit including a first ring frame having a first opening portion disposed in a center of the first ring frame, a first adhesive tape affixed to the first ring frame in such a manner as to close the first opening portion, and the wafer affixed to the first adhesive tape in the first opening portion of the first ring frame. The wafer transfer method includes a ring frame disposing step of facing the second ring frame to a surface of the first ring frame of the first work unit, the first ring frame surface not being affixed to the first adhesive tape, while superposing the second opening portion on the first opening portion, and superposing the second ring frame on the first ring frame without bringing the second ring frame into contact with the first ring frame, by sandwiching a claw body between the first ring frame and the second ring frame, an affixing step of affixing the second adhesive tape to a surface of the wafer, the wafer surface not being affixed to the first adhesive tape, in a state in which the first ring frame and the second ring frame are superposed on each other without being in contact with each other, and holding the wafer by the second ring frame via the second adhesive tape, and a peeling step of peeling off the first adhesive tape from the wafer and peeling off the first adhesive tape from the first ring frame in the state in which the first ring frame and the second ring frame are superposed on each other without being in contact with each other.

Preferably, in the affixing step, the second adhesive tape affixed to the second ring frame in advance is affixed to the wafer.

In addition, preferably, the wafer transfer method further includes a cleaning step of cleaning the wafer with liquid after the peeling step.

Further, preferably, in the peeling step, a peeling tape is affixed to the first adhesive tape, and the first adhesive tape is peeled off from the first ring frame and the wafer by the peeling tape by moving the peeling tape.

In addition, preferably, when the wafer is affixed to the second adhesive tape in the affixing step, the wafer is brought close to the second adhesive tape by adjusting relative positions of the wafer and the first ring frame in a penetrating direction of the first opening portion in advance while the first adhesive tape is deformed.

In accordance with another aspect of the present invention, there is provided a wafer transfer apparatus for forming a second work unit by transferring a wafer of a first work unit to a second adhesive tape that is affixed to a second ring frame in such a manner as to close a second opening portion disposed in a center of the second ring frame, the first work unit including a first ring frame having a first opening portion disposed in a center of the first ring frame, a first adhesive tape affixed to the first ring frame in such a manner as to close the first opening portion, and the wafer affixed to the first adhesive tape in the first opening portion of the first ring frame. The wafer transfer apparatus includes a first work unit supporting unit including a wafer supporting portion configured to support the wafer via the first adhesive tape and a ring frame supporting portion configured to support the first ring frame via the first adhesive tape, the first work unit supporting unit being configured to support the first work unit in a state in which a surface of the wafer, the wafer surface not being affixed to the first adhesive tape, is exposed upward, a second ring frame supporting unit including a first claw portion having a function of supporting the second ring frame in such a manner as to face the first ring frame supported by the ring frame supporting portion of the first work unit supporting unit and a function of being sandwiched between the first ring frame and the second ring frame, the second ring frame supporting unit being configured to be able to move the first claw portion between a region between the first ring frame and the second ring frame and an outside of the region, a tape affixing unit disposed above the second ring frame supporting unit, the tape affixing unit being configured to affix the second adhesive tape to a surface of the wafer supported by the wafer supporting portion of the first work unit supporting unit, the wafer surface not being affixed to the first adhesive tape, a holding unit having a second claw portion, the holding unit being configured to hold the second ring frame by the second claw portion by inserting the second claw portion between the first ring frame and the second ring frame and hold the wafer via the second adhesive tape, and a peeling unit configured to peel off the first adhesive tape from the wafer and peel off the first adhesive tape from the first ring frame in a state in which the holding unit holds the wafer.

Preferably, the wafer transfer apparatus further includes a tape supply unit configured to affix the second adhesive tape to the second ring frame in such a manner as to close the second opening portion in advance before the second ring frame supporting unit supports the second ring frame.

In addition, preferably, the wafer transfer apparatus further includes a cleaning unit configured to clean, with liquid, the wafer from which the first adhesive tape has been peeled off by the peeling unit.

More preferably, the peeling unit includes a peeling tape supply unit to which a peeling tape formed by a base material and an adhesive layer formed on one surface of the base material is drawably fitted in a state of being rolled in a roll shape, a plurality of rollers configured to guide the peeling tape drawn out from the peeling tape supply unit and form a traveling path of the peeling tape, a moving body having a pressing portion configured to affix the peeling tape to the first adhesive tape by pressing the peeling tape against the first adhesive tape, a driving unit configured to move the moving body, and a winding unit configured to wind and collect the peeling tape, and the peeling unit affixes the peeling tape to the first adhesive tape by pressing the peeling tape against the first adhesive tape by the pressing portion, moves the peeling tape by moving the moving body by the driving unit, peels off the first adhesive tape from the first ring frame and the wafer by the peeling tape, and is able to wind and collect, by the winding unit, the peeling tape to which the first adhesive tape is affixed.

In addition, preferably, the first work unit supporting unit further includes a raising and lowering unit configured to raise and lower the wafer supporting portion and the ring frame supporting portion relative to each other.

In the wafer transfer method and the wafer transfer apparatus according to one aspect of the present invention, first, the second ring frame is superposed on the first ring frame of the first work unit, and at this time, a claw body (claw portion) is sandwiched between the first ring frame and the second ring frame. Then, the claw body performs a function of a separator, so that the second ring frame is superposed on the first ring frame without being in contact with the first ring frame. Then, the second adhesive tape is affixed to the wafer, and the wafer is held by the second ring frame via the second adhesive tape. Finally, the first adhesive tape is peeled off from the wafer and the first ring frame. The second work unit which includes the wafer, the second adhesive tape, and the second ring frame is consequently formed. The transfer of the wafer is thereby completed. When the wafer is thus transferred, a process of cutting the first adhesive tape by a cutting tool is unnecessary. Therefore, the cutting tool does not come into contact with the wafer, nor does the adhesion of cutting waste attendant on the cutting of the first adhesive tape to the wafer occur.

In particular, a predetermined interval is formed between the second ring frame and the first ring frame by sandwiching the claw body (claw portion) between the second ring frame and the first ring frame. Therefore, a situation in which, when the second adhesive tape is affixed to the wafer, the second adhesive tape hangs down and sticks to the first adhesive tape is prevented.

Hence, one aspect of the present invention provides a wafer transfer method and a wafer transfer apparatus that can transfer a wafer safely by replacing an adhesive tape without cutting the adhesive tape.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will hereinafter be described in detail with reference to the accompanying drawings. In a wafer transfer method and a wafer transfer apparatus according to the present embodiment, a wafer affixed to a first adhesive tape is transferred to a second adhesive tape. That is, the first adhesive tape affixed to the wafer is replaced with the second adhesive tape. Then, the wafer that has been included in a first work unit is set in a state of being included in a second work unit.

Figure 1A:
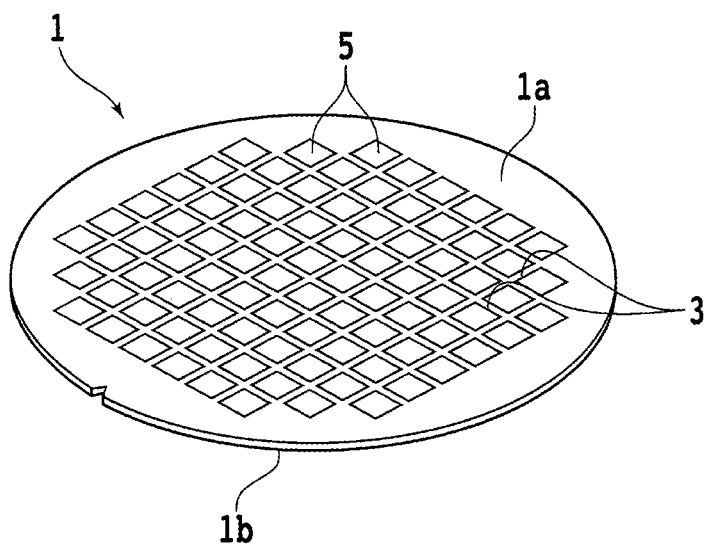
FIG. 1A is a perspective view schematically illustrating a wafer.
Figure 1B:
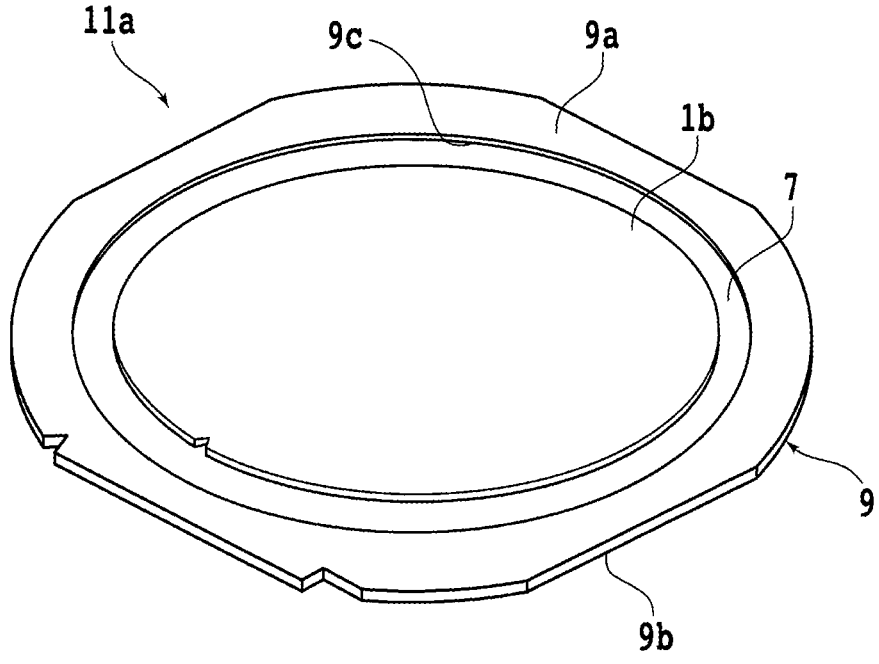
FIG. 1B is a perspective view schematically illustrating a first work unit.

The wafer to be transferred from the first adhesive tape to the second adhesive tape will first be described. FIG. 1A is a perspective view illustrating a top surface 1a side of the wafer, denoted by 1. FIG. 1B includes a perspective view illustrating an undersurface 1b side of the wafer 1. The wafer 1 is, for example, a substantially disk-shaped substrate or the like formed of a material such as silicon (Si), silicon carbide (SiC), gallium nitride (GaN), gallium arsenide (GaAs), or another semiconductor. However, the wafer 1 is not limited to this. The top surface 1a of the wafer 1 is demarcated by a plurality of planned dividing lines 3 intersecting one another. A device 5 such as an IC or LSI is formed in each of regions demarcated by the planned dividing lines 3 on the top surface 1a of the wafer 1. When the wafer 1 is divided along the planned dividing lines 3, individual device chips having respective devices 5 can be manufactured. The wafer

1 is divided by a processing apparatus such as a cutting apparatus or a laser processing apparatus.

When the wafer 1 is to be loaded into the processing apparatus, a work unit is formed in advance by integrating the wafer 1, an adhesive tape referred to also as a dicing tape, and a ring frame formed of a material such as metal. At this time, when the adhesive tape is affixed to the undersurface 1b side of the wafer 1, the top surface 1a side is exposed. Therefore, processing waste or the like produced by processing adheres to the devices 5, and contaminates the devices 5. Thus, there is a case where a frame unit is formed by affixing the top surface 1a side of the wafer 1 to the adhesive tape. FIG. 1B is a perspective view schematically illustrating a first work unit 11a formed by integrating a first ring frame 9, a first adhesive tape 7, and the wafer 1.

The first ring frame 9 is formed of a metallic material such as aluminum or stainless steel. A first opening portion 9c is provided in the center of the first ring frame 9. The first opening portion 9c penetrates from a top surface 9a to an undersurface 9b of the first ring frame 9, and has a diameter larger than the diameter of the wafer 1.

The first adhesive tape 7 is affixed to the first ring frame 9 in such a manner as to close the first opening portion 9c. The first adhesive tape 7 has a diameter larger than the diameter of the first opening portion 9c of the first ring frame 9. The first adhesive tape 7, for example, includes a base material layer formed by a resin film or the like and an adhesive layer formed on one surface of the base material layer. Incidentally, the adhesive layer is preferably formed by a UV curing resin. In this case, the adhesive force of the adhesive layer can be decreased by application of UV rays to the first adhesive tape 7. When the first adhesive tape 7 is affixed to the first ring frame 9 in such a manner as to close the first opening portion 9c, the adhesive layer of the first adhesive tape 7 is exposed in the first opening portion 9c. Then, the wafer 1 is affixed to the first adhesive tape 7 from the top surface 1a side in the first opening portion 9c.

The wafer 1 is transported to the processing apparatus in a state in which the wafer 1 is included in the first work unit 11a illustrated in FIG. 1B, and the wafer 1 is then processed and divided. Thereafter, the first work unit 11a is unloaded from the processing apparatus. However, when the first adhesive tape 7 is affixed to the top surface 1a side of the wafer 1, it is difficult to check circuit patterns constituting the devices 5 or the like. Accordingly, in the wafer transfer method and the wafer transfer apparatus according to the present embodiment, the wafer 1 is transferred by affixing a second adhesive tape to the undersurface 1b side of the wafer 1 and peeling off the wafer 1 from the first adhesive tape 7. Then, a second work unit constituted by the wafer 1, the second adhesive tape, and a second ring frame is formed. However, the wafer transfer method and the wafer transfer apparatus according to the present embodiment are not limited to this. The first adhesive tape 7 may be affixed to the undersurface 1b of the wafer 1, and the second adhesive tape may be affixed to the top surface 1a of the wafer 1. In the following, description will be made by taking as an example a case where the first work unit 11a is formed by affixing the first adhesive tape 7 to the top surface 1a side of the wafer 1 and where the second work unit is formed by affixing the second adhesive tape to the undersurface 1b and peeling off the first adhesive tape 7 from the top surface 1a side. However, in the following description, the top surface 1a and the undersurface 1b may be replaced with each other.

Figure 2:
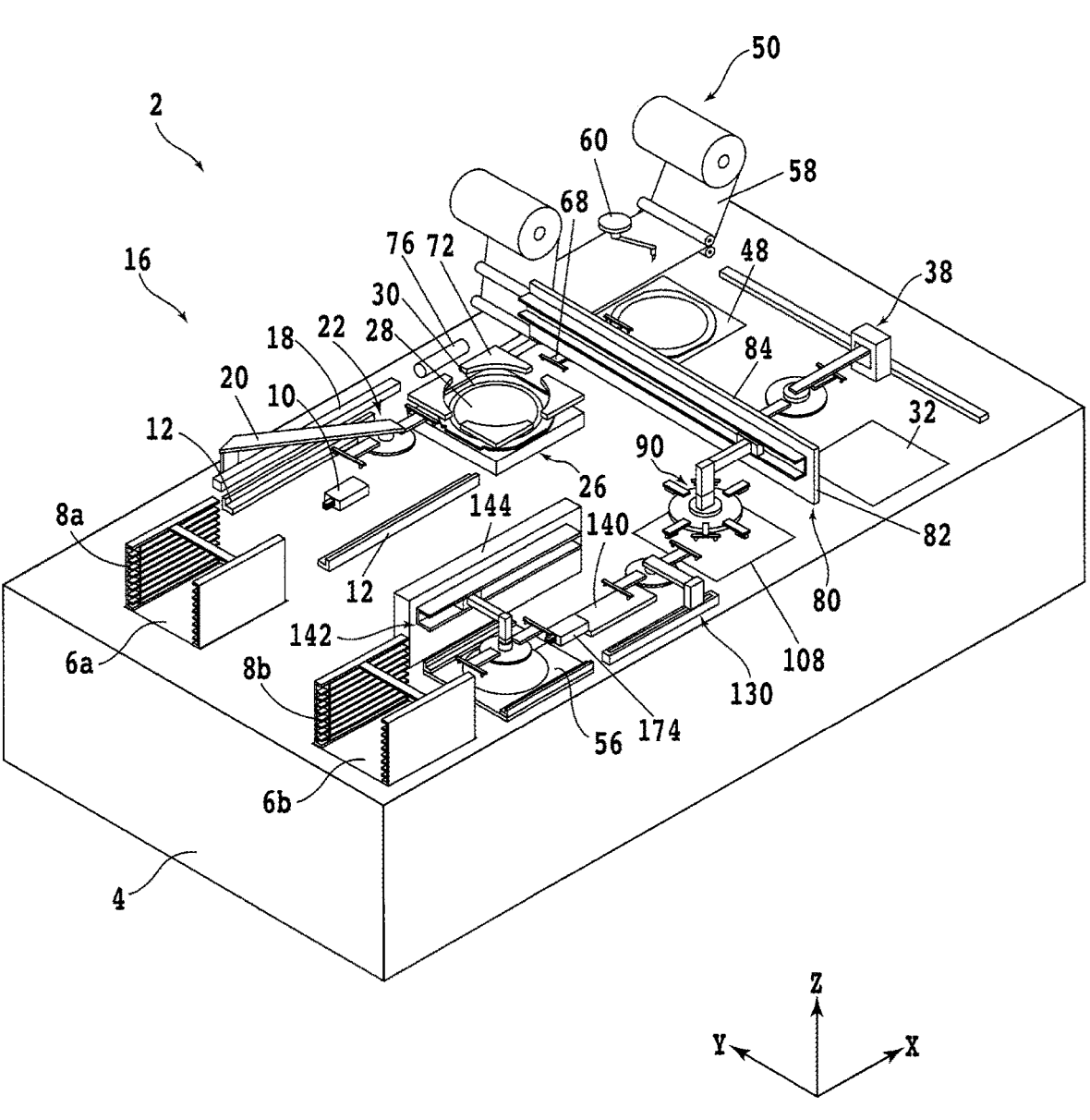
FIG. 2 is a perspective view schematically illustrating a wafer transfer apparatus.

The transfer of the wafer 1 is performed by a wafer transfer apparatus 2 illustrated in FIG. 2. The wafer transfer apparatus 2 will first be described in detail. FIG. 2 is a perspective view schematically illustrating the wafer trans-fer apparatus 2. The first work unit 11*a* including the wafer 1 is loaded into the wafer transfer apparatus 2 in a state in which the first work unit 11*a* is housed in a cassette 8*a* that can house a plurality of first work units 11*a*. In addition, the second work unit formed by transferring the wafer 1 in the wafer transfer apparatus 2 is housed into a cassette 8*b* that can house a plurality of second work units. As illustrated in FIG. 2, the wafer transfer apparatus 2 includes a base 4 that supports each constituent element. Arranged on the front side of the base 4 are a cassette table 6*a* on which the cassette 8*a* housing the first work unit 11*a* is mounted and a cassette table 6*b* on which the cassette 8*b* housing the second work unit is mounted. The cassette tables 6*a* and 6*b* can be raised and lowered in an upward-downward direction (Z-axis direction) by a raising and lowering mechanism (not illustrated).

Both side walls of housing spaces of the cassettes 8*a* and 8*b* are respectively provided with a plurality of housing rails at height positions corresponding to each other. The ring frame of a work unit housed in the cassette 8*a* or 8*b* has one end mounted on the housing rail provided to one side wall, and has another end mounted on the corresponding housing rail provided to the other side wall.

In the wafer transfer apparatus 2, the cassette 8*a* housing a plurality of first work units 11*a* is mounted on the cassette table 6*a*, the first work units 11*a* are unloaded from the cassette 8*a* one after another, and the wafer 1 included in each of the first work units 11*a* is reaffixed to the second adhesive tape. Then, second work units formed are housed into the cassette 8*b* mounted on the cassette table 6*b* one after another.

On a rear side (X-axis positive direction side) of the upper surface of the base 4 which rear side is adjacent to the cassette table 6*a*, provided is a temporary placement table which is formed by a pair of guide rails 12 that are brought into proximity to and separated from each other while maintaining a state of being parallel with an X-axis direction. In addition, at a position adjacent to the temporary placement table on the upper surface of the base 4, provided is a push-pull arm (unloading unit) 10 which unloads, from the cassette 8*a*, a first work unit 11*a* housed in the cassette 8*a* mounted on the cassette table 6*a*.

Figure 3:
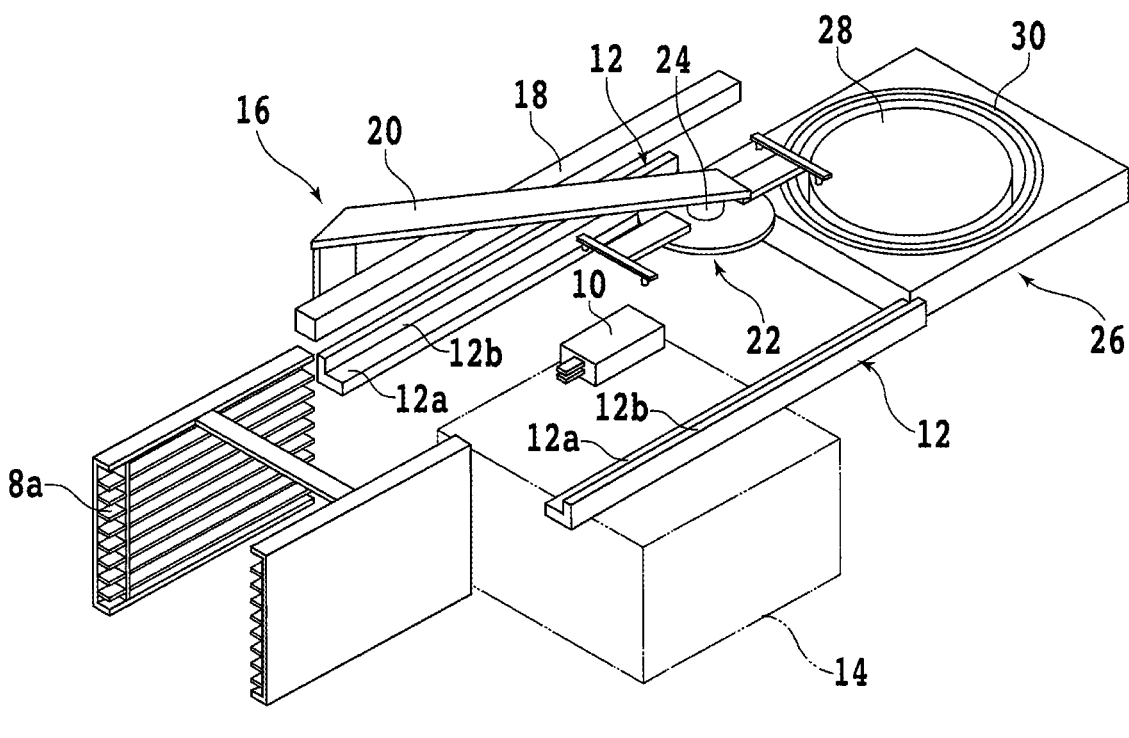
FIG. 3 is a perspective view schematically illustrating a cassette, a push-pull arm, a first ultraviolet (UV) irradiating unit, a first work unit transporting unit, and a work unit supporting unit.
Figure 3:
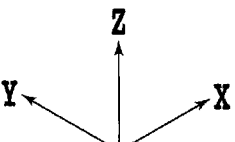

FIG. 3 is a perspective view schematically illustrating the cassette 8*a* mounted on the cassette table 6*a*, the pair of guide rails 12, and the push-pull arm 10. The pair of guide rails 12 each includes a horizontal supporting surface 12*a* (along an XY plane) that supports the first ring frame 9 of the first work unit 11*a* from below and a butting surface 12*b* substantially perpendicular to the supporting surface 12*a* (along an XZ plane). The butting surfaces 12*b* of the respective guide rails 12 face each other. The push-pull arm 10 is connected to a moving mechanism (not illustrated) that moves the push-pull arm 10 along the X-axis direction. The push-pull arm 10 is movable along the X-axis direction by the moving mechanism. A surface of the push-pull arm 10 which surface faces the cassette 8*a* (cassette table 6*a*) is provided with a gripping unit that grips the first ring frame 9 of the first work unit 11*a*. The gripping unit grips the first ring frame 9 from above and from below.

As illustrated in FIG. 3, the wafer transfer apparatus 2 includes a first UV irradiating unit 14 in a region within the base 4 and directly below the pair of guide rails 12. In FIG. 3, the first UV irradiating unit 14 is indicated by a chain double-dashed line. The first UV irradiating unit 14 has a function of irradiating the first work unit 11*a* pulled out to the pair of guide rails 12 with UV rays from below. The first UV irradiating unit 14 includes a UV light source.

When the first work unit 11*a* housed in the cassette 8*a* is to be unloaded by the push-pull arm (unloading unit) 10, the push-pull arm 10 is moved to the cassette 8*a*, and the push-pull arm 10 is made to grip the first ring frame 9. Incidentally, at this time, the cassette table 6*a* is raised or lowered in advance such that the height of the first work unit 11*a* to be unloaded and the height of the gripping unit of the push-pull arm 10 correspond to each other. Thereafter, when the push-pull arm 10 is moved in a direction of separating from the cassette 8*a*, the first work unit 11*a* is pulled out onto the supporting surfaces 12*a* of the guide rails 12 from the cassette 8*a*. At this time, the first work unit 11*a* is positioned at a predetermined position in the X-axis direction by adjusting the position of the push-pull arm 10. The gripping of the first ring frame 9 by the push-pull arm 10 is thereafter released. Next, when the pair of guide rails 12 are moved in a direction of approaching each other in an interlocked manner and the first ring frame 9 is sandwiched between the respective butting surfaces 12*b* of the pair of guide rails 12, the first work unit 11*a* is positioned at a predetermined position in a Y-axis direction.

In addition, the first UV irradiating unit 14 irradiates the first work unit 11*a* pulled out onto the pair of guide rails 12 with UV rays from below. In a case where the adhesive layer of the first adhesive tape 7 is formed by a UV curing resin, the adhesive force of the adhesive layer is decreased when the first adhesive tape 7 is irradiated with UV rays. There-fore, the first adhesive tape 7 is peeled off easily and cleanly when the first adhesive tape 7 is peeled off from the wafer 1 and the first ring frame 9, as will be described later.

The wafer transfer apparatus 2 includes a first work unit supporting unit 26 at a position adjacent to the temporary placement unit formed by the pair of guide rails 12. The first work unit supporting unit 26 has a function of supporting the first work unit 11*a*. When the first work unit 11*a* is supported by the first work unit supporting unit 26, the undersurface 1*b* of the wafer 1 which undersurface is on a side opposite to the top surface 1*a* affixed to the first adhesive tape 7 is exposed upward.

The first work unit supporting unit 26 includes a wafer supporting portion 28 that supports the wafer 1 of the first work unit 11*a* via the first adhesive tape 7 and a ring frame supporting portion 30 that supports the first ring frame 9 via the first adhesive tape 7. The wafer supporting portion 28 has a circular shape such that an upper surface thereof serving as a supporting surface has substantially the same diameter as that of the wafer 1. In addition, the ring frame supporting portion 30 has an annular upper surface serving as a sup-porting surface, and an inner circumferential edge of the ring frame supporting portion 30 has substantially the same diameter as that of the first opening portion 9*c* of the first ring frame 9.

In addition, the first work unit supporting unit 26 includes a raising and lowering unit (not illustrated) that raises and lowers the wafer supporting portion 28 and the ring frame supporting portion 30 relative to each other. The raising and lowering unit is not particularly limited to any kind. How-ever, a ball screw type raising and lowering mechanism, a raising and lowering mechanism including an air cylinder, or the like can be applied to the raising and lowering unit. The wafer supporting portion 28 and the ring frame supporting portion 30 are each raisable and lowerable along a Z-axis direction independently. Further, the wafer supporting por-tion 28 may include a heating mechanism (heater) such as a heating wire, and may thereby be capable of heating the wafer 1 supported by the wafer supporting portion 28 to a predetermined temperature within a range of 30° C. to 80° C. When the wafer 1 supported by the wafer supporting portion 28 is heated in advance, the second adhesive tape is heated and softened at a time of affixing the second adhesive tape to the wafer 1 as described later. In this case, the second adhesive tape is easily deformed to follow the shape of the adhered surface (undersurface 1b) of the wafer 1, so that the adhesive force of the second adhesive tape is strengthened.

The wafer transfer apparatus 2 includes a first work unit transporting unit 16 that transports the first work unit 11a from the temporary placement unit formed by the pair of guide rails 12 to the first work unit supporting unit 26. The first work unit transporting unit 16 transports the first work unit 11a positioned at the predetermined positions in the X-axis direction and the Y-axis direction, by a predetermined operation. The first work unit transporting unit 16 thereby transports the first work unit 11a to a predetermined position on the first work unit supporting unit 26. The first work unit transporting unit 16 includes a rail 18 along the X-axis direction, an arm unit 20 having a proximal end side slidably fitted to the rail 18, and a holding unit 22 provided via a raising and lowering mechanism 24 to a lower side of a distal end of the arm unit 20 extending along a horizontal direction. The holding unit 22, for example, has a function of holding under suction the first ring frame 9 of the first work unit 11a from above. In addition, the raising and lowering mechanism 24 is formed by an air cylinder or the like, and has a function of raising and lowering the holding unit 22.

Returning to FIG. 2, the description of the wafer transfer apparatus 2 will be continued. The wafer transfer apparatus 2 includes a second ring frame supporting unit 72 for supporting a second ring frame above the first work unit supporting unit 26. The second ring frame supporting unit 72 will be described later in detail. The wafer transfer apparatus 2 has a supply mechanism for supplying the second ring frame to the second ring frame supporting unit 72 on the rear side (far side in the X-axis direction) of the first work unit supporting unit 26 on the base 4.

Figure 4:
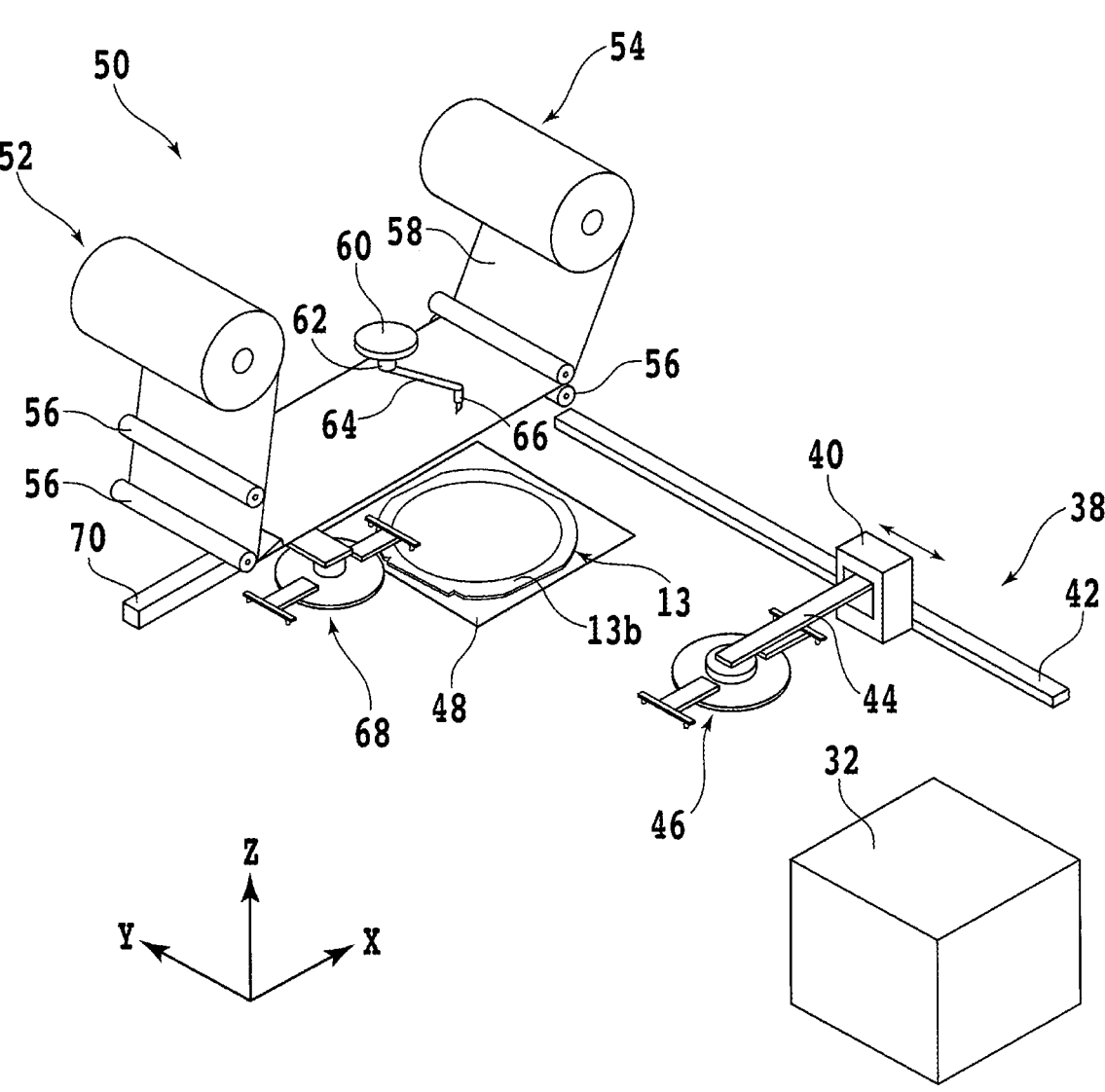
FIG. 4 is a perspective view schematically illustrating a ring frame housing unit, a ring frame transporting unit, a ring frame support table, and an adhesive tape supply unit.

The second ring frame supply mechanism will be described with reference to FIG. 4. FIG. 4 is a perspective view schematically illustrating a ring frame housing unit 32, a ring frame transporting unit 38, a ring frame support table 48, and an adhesive tape supply unit 50.

The ring frame housing unit 32 has a function of housing a plurality of second ring frames in a stacked manner. The ring frame housing unit 32 is disposed within the base 4. The second ring frame used to form a second work unit is supplied from the ring frame housing unit 32.

Figure 5:
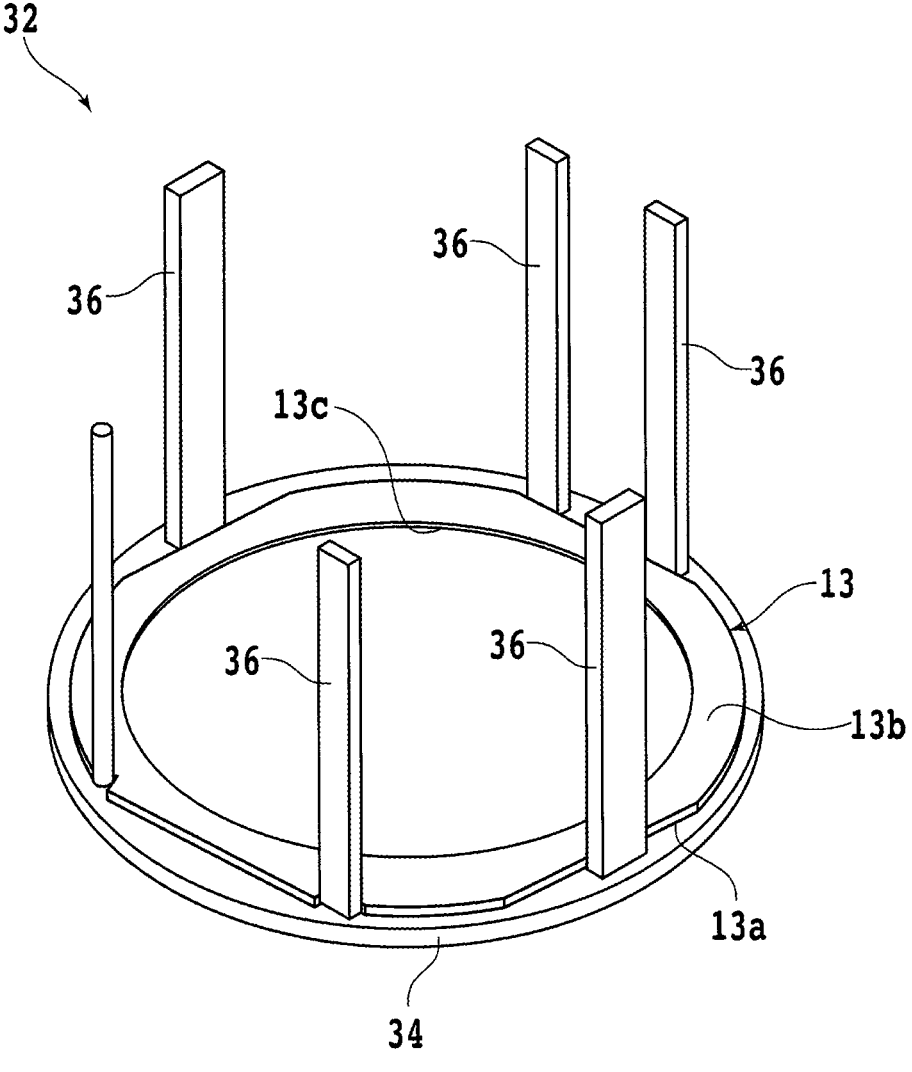
FIG. 5 is a perspective view schematically illustrating the ring frame housing unit.

FIG. 5 is a perspective view schematically illustrating the ring frame housing unit 32. FIG. 5 schematically illustrates a second ring frame 13 housed in the ring frame housing unit 32. FIG. 5 illustrates one second ring frame 13 housed in the ring frame housing unit 32, for the convenience of description. It is needless to say that the number of second ring frames 13 housed in the ring frame housing unit 32 is not limited to one. Here, the second ring frame 13 is formed in a manner similar to that of the first ring frame 9. Specifically, the second ring frame 13 is formed of a metallic material such as aluminum, and a second opening portion 13c that penetrates a top surface 13a and an undersurface 13b is formed in the center of the second ring frame 13. The second ring frame 13 is, for example, housed in the ring frame housing unit 32 in a state in which the top surface 13a is oriented downward and the undersurface 13b side to which the second adhesive tape is affixed as described later is oriented upward.

The ring frame housing unit 32 includes a support table 34 on which a plurality of stacked second ring frames 13 are to be mounted and a plurality of positioning posts 36 that are erected from an outer circumferential portion of the support table 34 to surround the second ring frame 13 from the periphery thereof. The peripheral edge of the second ring frame 13 has a notch portion, a linear portion, and an arcuate portion formed for various purposes. The positioning posts 36 are arranged at positions corresponding to the shape of the peripheral edge of the second ring frame 13. The positioning posts 36 regulate the position, orientation, and obverse and reverse of the second ring frame 13 housed in the ring frame housing unit 32. Conversely, the second ring frame 13 cannot be mounted on the support table 34 unless in a predetermined position and a predetermined orientation. In addition, the second ring frame 13 cannot be mounted on the support table 34 in a state in which the top surface 13a is oriented upward and the undersurface 13b is oriented downward, because of obstruction by the positioning posts 36. Therefore, when the second ring frame 13 housed in the ring frame housing unit 32 is transported by a predetermined transporting operation, the second ring frame 13 can be supplied to a predetermined place in a predetermined position and a predetermined orientation.

Description will next be made of the ring frame transporting unit 38 that transports the second ring frame 13 housed in the ring frame housing unit 32. As illustrated in FIG. 4, the ring frame transporting unit 38 includes a rail 42 along the Y-axis direction, a moving body 40 slidably fitted to the rail 42, an arm unit 44 extending from the moving body 40 in the X-axis direction, and a holding unit 46 provided to a distal end of the arm unit 44. The arm unit 44 can be raised and lowered along the moving body 40. Specifically, the ring frame transporting unit 38 includes an unillustrated raising and lowering mechanism in the moving body 40, and thereby raises and lowers the arm unit 44 along the Z-axis direction. In addition, the holding unit 46 can hold the second ring frame 13 under suction from above. Specifically, the ring frame transporting unit 38 has an unillustrated suction mechanism that is connected to the holding unit 46, and can therefore transport the second ring frame 13 while holding the second ring frame 13 under suction. One end of the rail 42 reaches the vicinity of the ring frame housing unit 32. Another end of the rail 42 reaches the vicinity of the ring frame support table 48 to be described next. The ring frame transporting unit 38 transports the second ring frame 13 from the ring frame housing unit 32 to the ring frame support table 48.

At the ring frame support table 48, the second adhesive tape is affixed to the undersurface 13b side of the second ring frame 13 in such a manner as to close the second opening portion 13c. The adhesive tape supply unit 50 that supplies the second adhesive tape to the second ring frame 13 is disposed above the ring frame support table 48. The adhesive tape supply unit 50 will next be described. The adhesive tape supply unit 50 includes a feeding roll 52 wound with a long length of a supply tape 58, a plurality of rollers 56 that form a traveling path of the supply tape 58 fed from the feeding roll 52, and a winding roll 54 that winds the supply tape 58. The adhesive tape supply unit 50 is supported by an unillustrated raising and lowering mechanism, and can thereby be raised and lowered above the ring frame support table 48.

The supply tape 58, for example, includes a base material layer formed of resin or the like and an adhesive layer formed on one surface of the base material layer. A second adhesive tape can be formed when the supply tape 58 is cut out into a predetermined shape. The adhesive tape supply unit 50 includes a cutting unit 60 that cuts out the supply tape 58. The cutting unit 60 includes a rotary shaft portion 62 along a Z-axis, an arm portion 64 extending along the horizontal direction from a lower end of the rotary shaft portion 62, and a cutter (cutting tool) 66 provided to a lower side of a distal end of the arm portion 64. The rotary shaft portion 62 of the cutting unit 60 is positioned directly above the center of the second opening portion 13c of the second ring frame 13 supported by the ring frame support table 48. In addition, the arm portion 64 is longer than the diameter of the second opening portion 13c. The cutting unit 60 has an unillustrated rotational driving source such as a motor, which rotates the rotary shaft portion 62. The cutting unit 60 moves the cutter 66 on an annular trajectory having the arm portion 64 as a diameter, by actuating the rotational driving source.

When the second adhesive tape is to be supplied from the adhesive tape supply unit 50 to the second ring frame 13, first, the adhesive tape supply unit 50 is lowered toward the second ring frame 13 supported by the ring frame support table 48. Then, the supply tape 58 is affixed to the exposed undersurface 13b side of the second ring frame 13. Thereafter, the supply tape 58 is cut out into a circular shape by rotationally moving the cutter 66 of the cutting unit 60 around the second opening portion 13c while making the cutter 66 cut into the supply tape 58 on the second ring frame 13.

A second adhesive tape 15 (see FIG. 6B and the like) can thereby be supplied to the undersurface 13b of the second ring frame 13. However, the supply tape 58 may be a support tape on which a plurality of second adhesive tapes formed in a predetermined shape in advance are arranged side by side, and the second adhesive tape 15 may be transferred from the supply tape 58 as the support tape to the second ring frame 13. In this case, the cutting unit 60 is unnecessary, and therefore, cutting waste is not produced accompanying the cutting of the supply tape 58.

In addition, the adhesive tape supply unit 50 does not have to be disposed above the ring frame support table 48, and the second adhesive tape 15 does not have to be supplied to the second ring frame 13 on the ring frame support table 48. For example, the adhesive tape supply unit 50 may supply the second adhesive tape 15 to the second ring frame 13 and the wafer 1 on the second ring frame supporting unit 72 to be described later.

The second ring frame 13 is transported from the ring frame support table 48 to the second ring frame supporting unit 72 disposed above the first work unit supporting unit 26. The wafer transfer apparatus 2 includes a ring frame transporting unit 68 that transports the second ring frame 13 from the ring frame support table 48 to the second ring frame supporting unit 72. The ring frame transporting unit 68 is configured in a manner similar to that of the ring frame transporting unit 38 described above. The ring frame transporting unit 68 includes a rail 70 along the X-axis direction, a moving body (not illustrated) slidably fitted to the rail 70, an arm unit extending in the Y-axis direction from the moving body, and a holding unit provided to a distal end of the arm unit. This holding unit can be raised and lowered, and can hold the second ring frame 13 under suction from above. That is, the ring frame transporting unit 68 can transport the second ring frame 13 while holding the second ring frame 13 under suction.

Figures 6A, 6B:
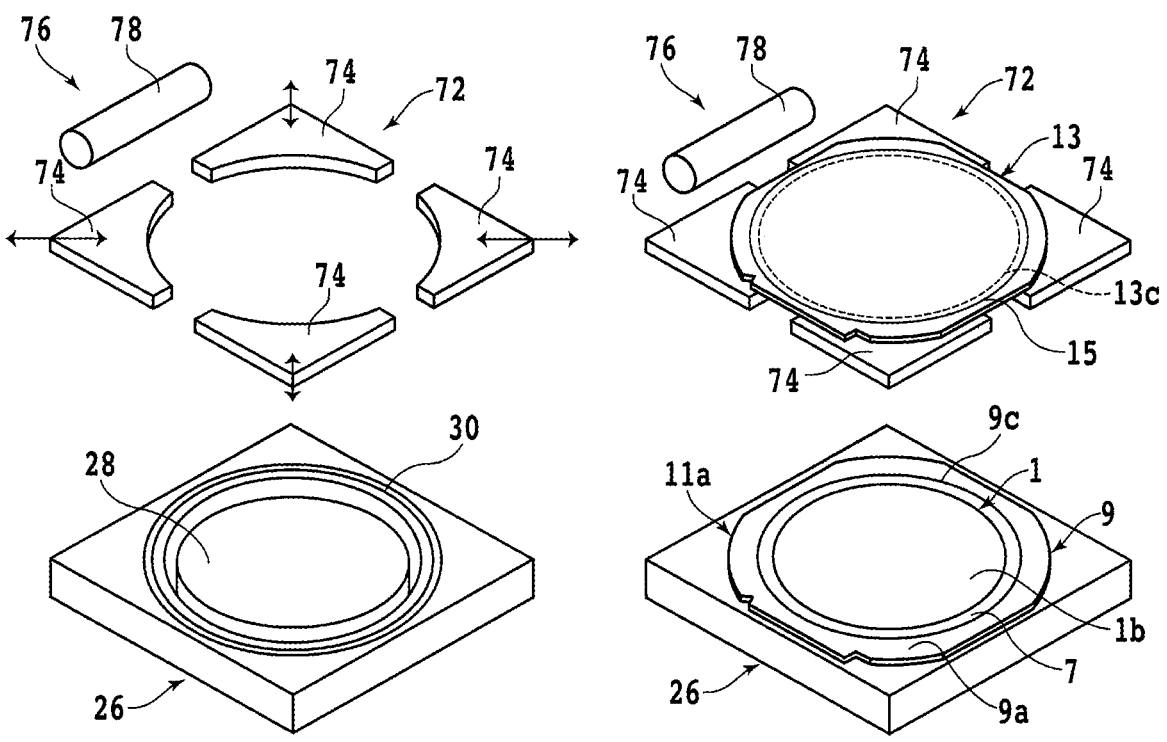
FIG. 6A is a perspective view schematically illustrating a first work unit supporting unit and a second ring frame supporting unit.
FIG. 6B is a perspective view schematically illustrating a ring frame disposing step.

The second ring frame supporting unit 72 will next be described. FIG. 6A schematically illustrates the second ring frame supporting unit 72. The second ring frame supporting unit 72 includes a plurality of first claw portions (claw bodies) 74 each having a thin plate shape. The plurality of first claw portions 74 are arranged on the same horizontal plane (on the XY plane) in such a manner as to annularly surround a central space. Gaps having predetermined intervals therebetween are secured between the first claw portions 74 adjacent to each other. Second claw portions 102 (see FIG. 9A and the like) of a holding unit 90 are inserted into the gaps, as will be described later.

The inner circumferential edge of each first claw portion 74 has an arcuate shape. The central space surrounded by the inner circumferential edges of the respective first claw portions 74 have a substantially circular shape. The second ring frame supporting unit 72 includes a sliding mechanism (not illustrated) that can slide each first claw portion 74 outward in the radial direction of the circular central space. The sliding mechanism is, for example, formed by a ball screw type moving mechanism or an air cylinder type expanding and contracting mechanism. The diameter of the circular space surrounded by the inner circumferential edges of the respective first claw portions 74 in a state in which each first claw portion 74 is not slid outward in the radial direction is a diameter larger than or the same diameter as the diameter of the first opening portion 9c of the first ring frame 9 and the diameter of the second opening portion 13c of the second ring frame 13. In this case, as will be described later, the first claw portions 74 are hidden by the first ring frame 9 and the second ring frame 13 when the second adhesive tape 15 is affixed to the wafer 1, so that the first adhesive tape 7 or the second adhesive tape 15 can be prevented from sticking to the first claw portions 74.

However, the diameter of the circular space is not limited to this. For example, the circular space may have a diameter that is smaller than the diameter of the first opening portion 9c and the diameter of second opening portion 13c and exceeds the diameter of the wafer 1. In this case, the first claw portions 74 prevent contact between the first adhesive tape 7 and the second adhesive tape 15 when the second adhesive tape 15 is affixed to the wafer 1. In this case, because there is a possibility of contact of the first adhesive tape 7 or the second adhesive tape 15 with the first claw portions 74, the surfaces of the first claw portions 74 are preferably subjected to processing that decreases a frictional force (fluorocarbon resin coating) or the like in order for the adhesive layer not to stick easily.

A usage mode of the second ring frame supporting unit 72 will next be described. First, the second ring frame 13 is transported onto the first claw portions 74. FIG. 6B schematically illustrates the second ring frame 13 supported by the first claw portions 74. In the example illustrated in FIG. 6B and the like, the second adhesive tape 15 is affixed to the upwardly exposed undersurface 13b side of the second ring frame 13. In FIG. 6B and the like, the second opening portion 13c of the second ring frame 13 is indicated by a broken line. The second ring frame 13 is transported to a predetermined position on the first claw portions 74 such that the centers of the circular space surrounded by the first claw portions 74 and the second opening portion 13c coincide with each other. In addition, the first work unit 11a is mounted on the first work unit supporting unit 26. At this time, the first claw portions 74 support the second ring frame 13 in such a manner as to face the first ring frame 9 supported by the ring frame supporting portion 30 of the first work unit supporting unit 26.

Figure 6C:
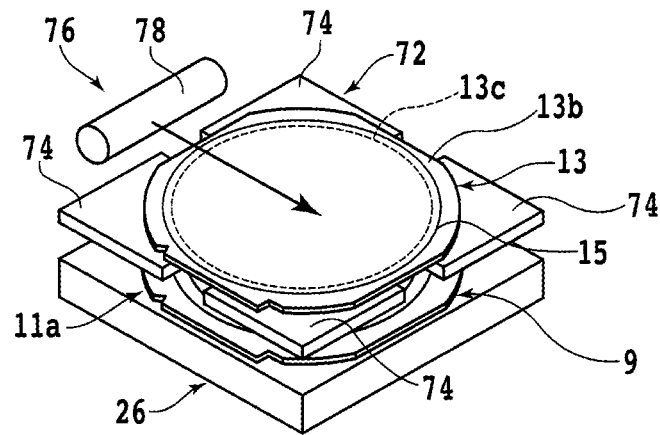
FIG. 6C is a perspective view schematically illustrating an affixing step.
Figure 7:
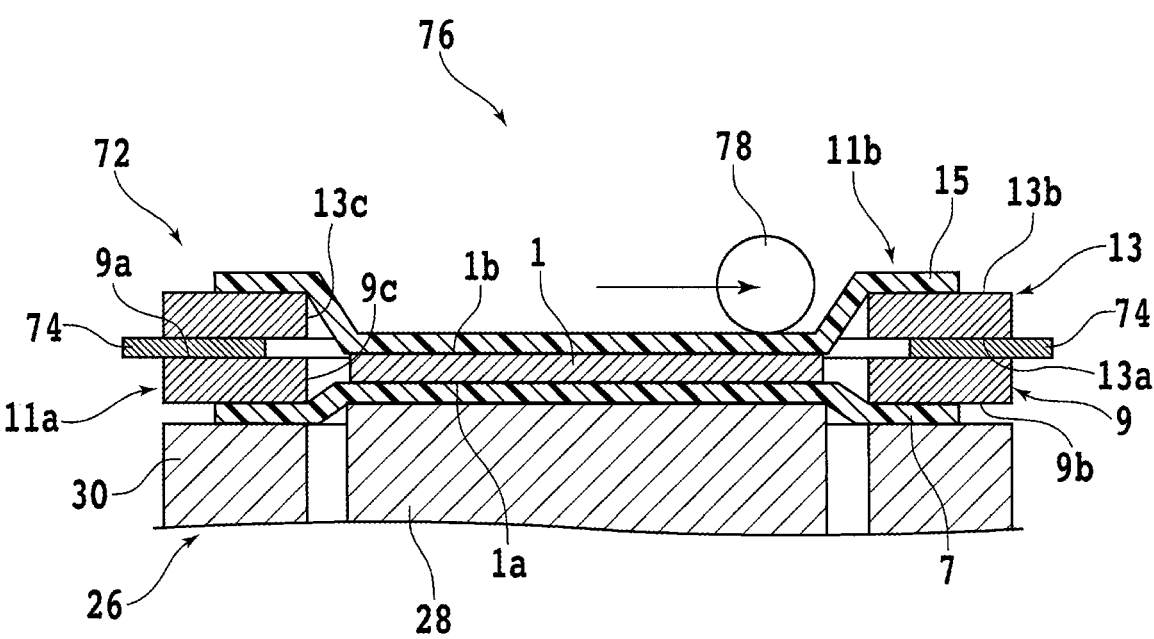
FIG. 7 is a sectional view schematically illustrating the affixing step.

Then, in this state, the wafer supporting portion 28 and the ring frame supporting portion 30 of the first work unit supporting unit 26 are raised. FIG. 6C is a perspective view schematically illustrating the wafer supporting portion 28 and the ring frame supporting portion 30 that are raised. In addition, FIG. 7 includes a sectional view schematically illustrating the wafer supporting portion 28 and the ring frame supporting portion 30 that are raised. When both of the supporting portions are raised, the first claw portions 74 are sandwiched between the first ring frame 9 and the second ring frame 13, as illustrated in FIG. 7. A distance between the first ring frame 9 and the second ring frame 13 at this time corresponds to the thickness of the first claw portions 74. That is, the first claw portions 74 function as a spacer that separates the two ring frames from each other at the predetermined distance. At this time, as illustrated in FIG. 7, the wafer supporting portion 28 of the first work unit supporting unit 26 is preferably raised higher than the ring frame supporting portion 30. For example, the wafer transfer apparatus 2 controls the height of the wafer supporting portion 28 such that the undersurface 1b of the wafer 1 is higher than the top surface 9a of the first ring frame 9. In this state, the second adhesive tape 15 is affixed to the undersurface 1b of the wafer 1.

Here, in a case where the wafer supporting portion 28 includes a heating mechanism, the wafer 1 is preferably heated to a predetermined temperature by actuating the heating mechanism. When the second adhesive tape 15 is in contact with the undersurface 1b of the wafer 1 at a high temperature, the second adhesive tape 15 is heated, and consequently is softened and deformed easily. For example, in a case where an uneven shape is formed on the undersurface 1b side of the wafer 1, when the second adhesive tape 15 is softened, the second adhesive tape 15 is affixed to the wafer 1 while being deformed in such a manner as to follow the uneven shape, so that the second adhesive tape 15 is affixed to the wafer 1 more securely.

The wafer transfer apparatus 2 includes a tape affixing unit 76 that is disposed above the second ring frame supporting unit 72 and that affixes the second adhesive tape 15 to the undersurface 1b of the wafer 1 supported by the wafer supporting portion 28 of the first work unit supporting unit 26. The tape affixing unit 76 includes a roller 78 that brings the second adhesive tape 15 into contact with the undersurface 1b of the wafer 1 and affixes the second adhesive tape 15 to the undersurface 1b of the wafer 1 by pressing the second adhesive tape 15 downward while rolling on the second adhesive tape 15. The roller 78 extends along the horizontal direction (XY plane), and is raisable and lowerable along a direction perpendicular to a horizontal plane (Z-axis direction) and is movable along a direction perpendicular to a direction in which the roller 78 extends on the horizontal plane. In order to make the roller 78 movable in the second opening portion 13c of the second ring frame 13, the length of the roller 78 is set smaller than the diameter of the second opening portion 13c of the second ring frame 13 and equal to or more than the diameter of the wafer 1.

As illustrated in FIG. 7, the tape affixing unit 76 lowers the roller 78 to the second opening portion 13c of the second ring frame 13, presses the second adhesive tape 15 from above, and thereby affixes the second adhesive tape 15 to one end of the undersurface 1b of the wafer 1. Then, the roller 78 is moved on the horizontal plane, so that the second adhesive tape 15 is affixed to the whole of the undersurface 1b of the wafer 1.

At this time, the first claw portions 74 separate the first ring frame 9 and the second ring frame 13 from each other at a predetermined interval. Moreover, the wafer supporting portion 28 of the first work unit supporting unit 26 is positioned higher than the ring frame supporting portion 30. In this case, distances from the second adhesive tape 15 to the first ring frame 9 and the first adhesive tape 7 become relatively large, while the wafer 1 approaches the second adhesive tape 15.

Therefore, even when the second adhesive tape 15 hangs down on the outside of the wafer 1, it becomes difficult for the second adhesive tape 15 to come into contact with the first ring frame 9 or the first adhesive tape 7. If the second adhesive tape 15 comes into contact with the first ring frame 9 or the first adhesive tape 7 and sticks to the first ring frame 9 or the first adhesive tape 7, work of peeling off the second adhesive tape 15 becomes necessary. At this time, there may be a case where a load is applied to the wafer 1 and the like and damage is caused to the wafer 1 and the like, or there may be a case where unnecessary elongation occurs in the second adhesive tape 15. When the adhesive layers of the first adhesive tape 7 and the second adhesive tape 15 come into contact with each other, in particular, the first adhesive tape 7 and the second adhesive tape 15 stick to each other with a very large force. When the adhesive layers are peeled off from each other, a force of a corresponding magnitude is applied to each element, and therefore, damage, deformation, elongation, or the like occurs in each constituent element, so that the second work unit cannot be formed in a desired state. Such problems can be prevented owing to a fact that a distance between the first ring frame 9 and the second ring frame 13 is secured by use of the first claw portions 74 as a separator and a fact that the wafer supporting portion 28 is raised relatively. This effect is particularly noticeable in a case where the first claw portions 74 are not arranged in such a manner as to overlap the first opening portion 9c and the second opening portion 13c and the first claw portions 74 are not inserted between the first adhesive tape 7 and the second adhesive tape 15.

For example, in a case where the diameter of the wafer 1 is 6 inches, the inside diameter of the first opening portion 9c of the first ring frame 9 is 194 mm, and the thickness of the first ring frame 9 and the second ring frame 13 is 1.2 mm, the thickness of the first claw portions 74 is preferably set at 2 mm. The length of the roller 78 is preferably 156 mm, which exceeds the diameter of the wafer 1. However, in each sectional view including FIG. 7, the first claw portions 74 are depicted in such a manner as to be thinner than the first ring frame 9 and the second ring frame 13, for the convenience of description. The thickness of each constituent element is not limited to the case illustrated in FIG. 7 and the like. When the first claw portions 74 exceeding the thickness of the first ring frame 9 and the second ring frame 13 are used, the first ring frame 9 and the second ring frame 13 can be separated from each other at a sufficient distance, and contact between the adhesive tapes can be prevented. However, the thickness of the first claw portions 74 is not limited to this.

When the wafer 1 is affixed to the second adhesive tape 15, formed is a combined body in which the first ring frame 9, the first adhesive tape 7, the second ring frame 13, the second adhesive tape 15, and the wafer 1 are integrated. The wafer transfer apparatus 2 forms a second work unit by separating the first ring frame 9 and the first adhesive tape 7 from the combined body.

As illustrated in FIG. 2, the wafer transfer apparatus 2 includes a peeling unit 108 that peels off the first adhesive tape 7 from the wafer 1 and that peels off the first adhesive tape 7 from the first ring frame 9. In addition, the wafer transfer apparatus 2 includes a combined body transporting mechanism 80 that transports the combined body including the wafer 1 to the peeling unit 108 while holding the combined body.

Figure 8:
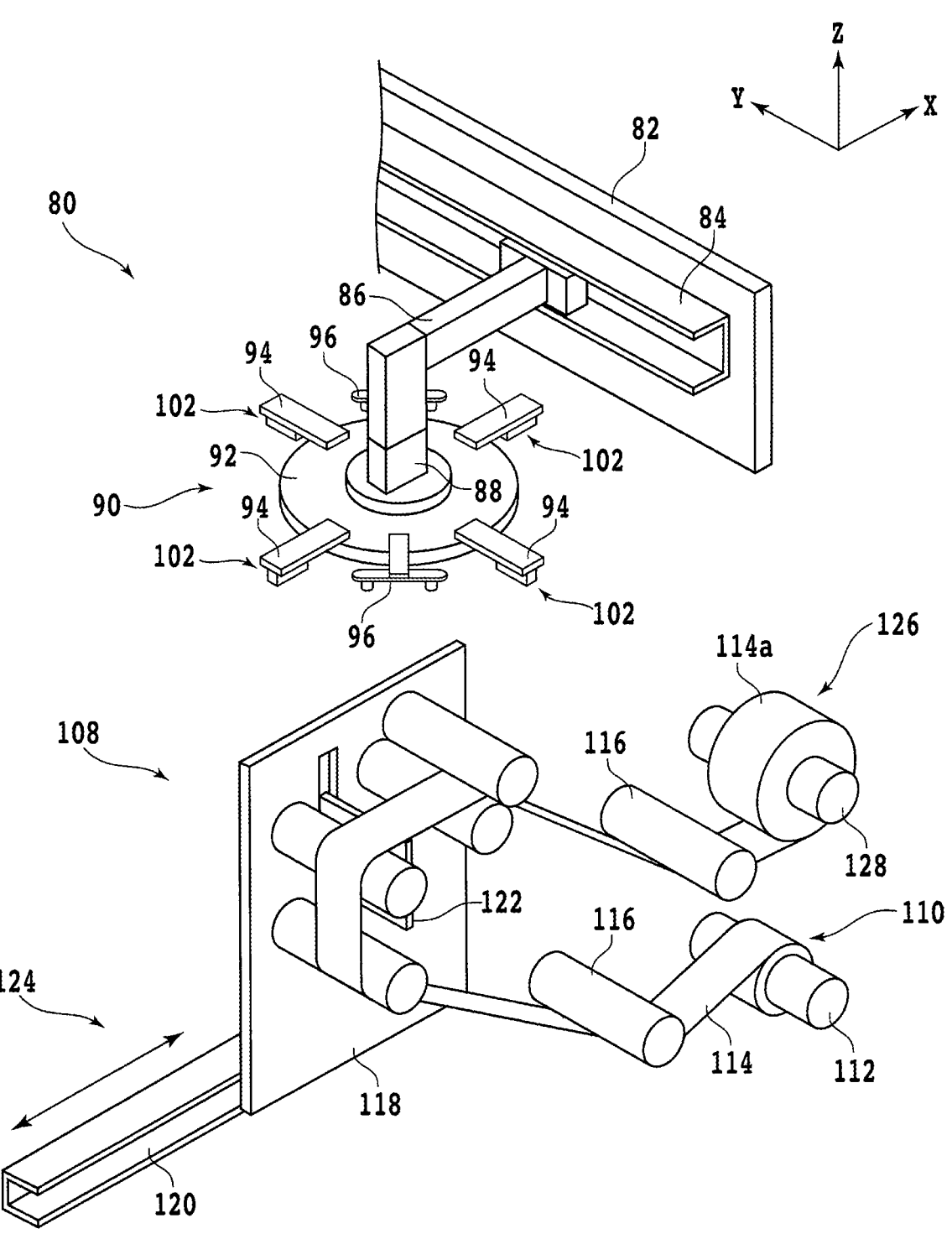
FIG. 8 is a perspective view schematically illustrating a holding unit and a peeling unit.

The combined body transporting mechanism 80 and operation thereof will be described. The combined body transporting mechanism 80 is movably supported by a supporting portion 82 that is along the Y-axis direction. FIG. 8 includes a perspective view schematically illustrating the combined body transporting mechanism 80. A rail 84 along the Y-axis direction is disposed on one surface of the supporting portion 82. The rail 84 has one end reaching the vicinity of the second ring frame supporting unit 72, and has another end reaching the vicinity of the peeling unit 108.

A proximal end of an arm unit 86 along the X-axis direction is slidably fitted to the rail 84. The holding unit 90 is fixed to a distal end of the arm unit 86 via a raising and lowering unit 88 formed by an air cylinder mechanism capable of expansion and contraction along the Z-axis direction or the like. That is, the height position of the holding unit 90 can be changed by actuating the raising and lowering unit 88.

The holding unit 90 has a function of holding the combined body including the first ring frame 9, the first adhesive tape 7, the wafer 1, the second adhesive tape 15, and the second ring frame 13. The combined body can be transported when the holding unit 90 holding the combined body is moved along the rail 84. The holding unit 90 includes a suction holding unit 92 that holds the wafer 1 under suction from above, a plurality of second claw portions 102 that hold the second ring frame 13, and third claw portions 106 that hold the first ring frame 9.

The suction holding unit 92 has a flat lower surface, and is connected to an unillustrated suction mechanism that communicates with the lower surface. The suction holding unit 92 thus has a function of holding the wafer 1 under suction via the second adhesive tape 15. In addition, the suction holding unit 92 may include a heating mechanism (heater) such as a heating wire, and may thereby be capable of heating the wafer 1 held by the suction holding unit 92 to a predetermined temperature within a range of 30° C. to 80° C.

Figure 9A:
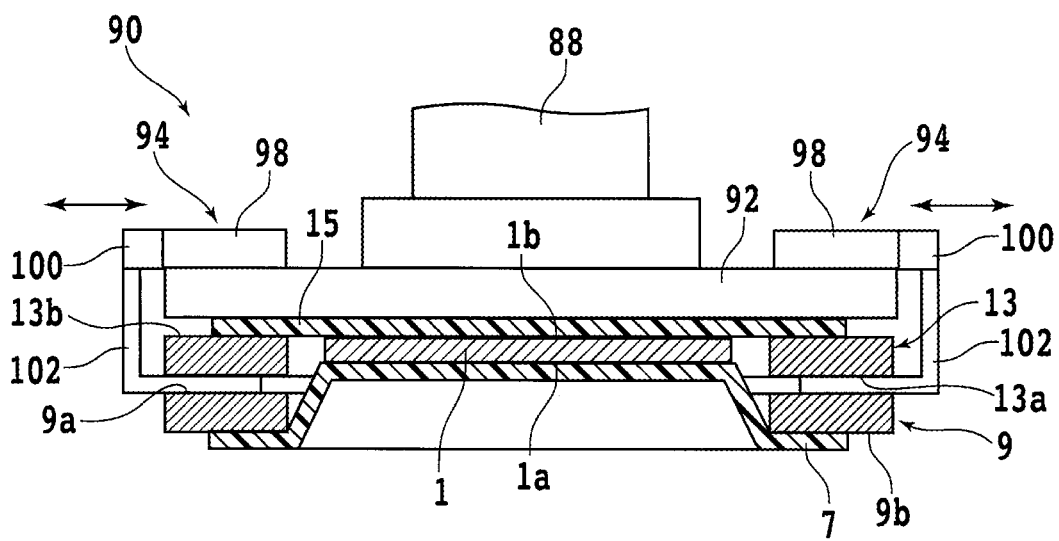
FIG. 9A is a sectional view schematically illustrating one cross section of a combined object held by the holding unit.
Figure 9B:
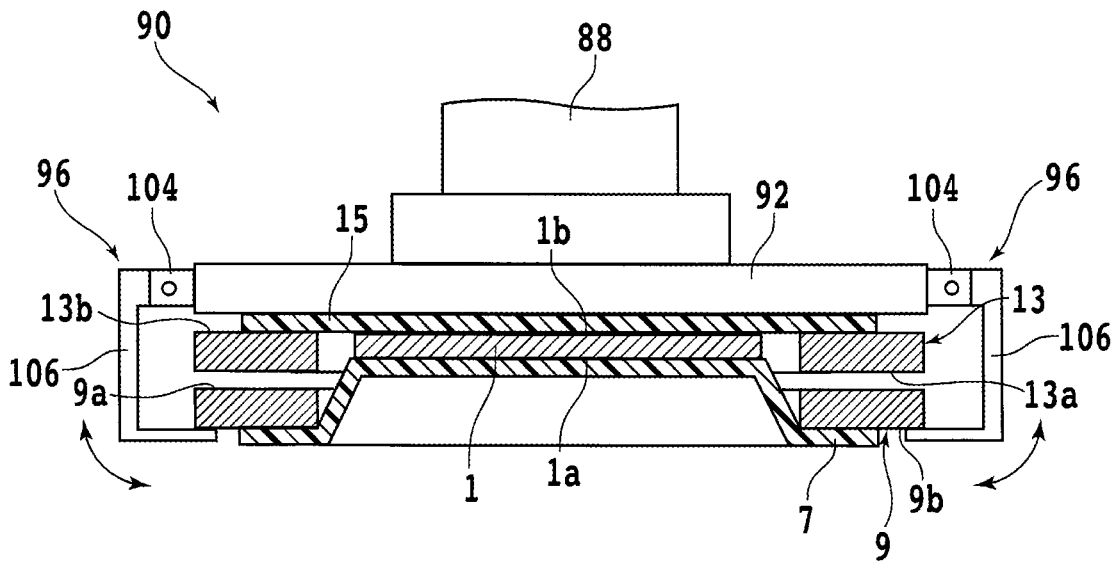
FIG. 9B is a sectional view schematically illustrating another cross section of the combined object held by the holding unit.

FIG. 9A is a sectional view schematically illustrating the holding unit 90 sectioned by an XZ plane or a YZ plane. In addition, FIG. 9B is a sectional view schematically illustrating the holding unit 90 sectioned by a plane obtained by rotating the XZ plane or the YZ plane by 45° about the Z-axis. As illustrated in FIG. 9A, the holding unit 90 includes a second claw portion moving unit 94 that moves each second claw portion 102 along the radial direction in the XY plane. The second claw portion moving unit 94, for example, includes an expanding and contracting unit 98 formed by an air cylinder mechanism or the like and a moving body 100 connected to a distal end of the expanding and contracting unit 98. The moving body 100 is connected with the second claw portion 102. When the expanding and contracting unit 98 is actuated, the second claw portion 102 moves along the radial direction of the holding unit 90. A distal end portion of the second claw portion 102 is formed in such a thickness and shape as to be insertable between the first ring frame 9 and the second ring frame 13. When the second claw portion moving unit 94 is actuated, the hook-shaped distal end portion of the second claw portion 102 can be advanced or retreated between the two ring frames. When the second claw portion 102 is advanced between the two ring frames, the second claw portion 102 is in contact with the downwardly oriented top surface 13a of the second ring frame 13, and holds the second ring frame 13 from below.

Incidentally, the arrangement positions of the second claw portions 102 of the holding unit 90 correspond to the positions of the gaps between the plurality of first claw portions 74 adjacent to each other in the second ring frame supporting unit 72 illustrated in FIG. 6A and the like. In a state in which the second ring frame 13 is supported by the first claw portions 74, the holding unit 90 can advance the second claw portions 102 into the gaps between the first claw portions 74 adjacent to each other, and can support the second ring frame 13 by the second claw portions 102 from below.

In addition, as illustrated in FIG. 9B, the holding unit 90 includes shaft portions 104 that rotatably connect upper ends of the third claw portions 106 to a peripheral portion of the suction holding unit 92. The holding unit 90 further includes third claw portion opening and closing units 96 that can open and close the third claw portions 106 by rotating the third claw portions 106 about the shaft portions 104 by unillustrated rotational driving sources. When the third claw portions 106 are closed by actuating the third claw portion opening and closing units 96, hook-shaped lower end portions of the third claw portions 106 go around to the lower side of the first ring frame 9, so that the third claw portions 106 support the first ring frame 9 from below. In addition, when the third claw portions 106 are opened by actuating the third claw portion opening and closing units 96, the support of the first ring frame 9 is released.

When the combined body including the first ring frame 9 and the like is to be transported while held by the holding unit 90, first, the holding unit 90 is placed on the second ring frame 13 supported by the first claw portions 74. At this time, in order to avoid interference of the third claw portions 106 with the first claw portions 74, the third claw portions 106 are opened in advance by actuating the third claw portion opening and closing units 96. Then, the second claw portions 102 are inserted into the gaps between the first ring frame 9 and the second ring frame 13 which gaps are formed and maintained by the first claw portions 74, while the wafer 1 is held under suction via the second adhesive tape 15 by actuating the suction holding unit 92. At this time, the second claw portions 102 advance between the first claw portions 74 adjacent to each other.

Here, the second ring frame supporting unit 72 can move the first claw portions 74 between a region between the first ring frame 9 and the second ring frame 13 and the outside of the region. Next, the support of the second ring frame 13 by the first claw portions 74 is released by moving the first claw portions 74 outward in the radial direction. Then, the combined body including the first ring frame 9 and the like is held by the holding unit 90. When the holding unit 90 is thereafter moved along the rail 84, the combined body can be transported. In a process of the transportation, the third claw portions 106 are closed by actuating the third claw portion opening and closing units 96, and the third claw portions 106 are thereby made to support the first ring frame 9 from below. At this time, the first claw portions 74 do not interfere with the third claw portions 106. FIG. 9A and FIG. 9B are sectional views schematically illustrating the holding unit 90 holding the combined body.

Here, the first claw portions 74 of the second ring frame supporting unit 72 are arranged in a predetermined height position that does not hinder processes performed in the wafer transfer apparatus 2. The predetermined height position is a height position that does not interfere with the transporting operation of the first work unit transporting unit 16 that transports the first work unit 11*a* from the pair of guide rails 12 to the first work unit supporting unit 26. In addition, the predetermined height position is a height position at which the first ring frame 9 can be sandwiched between the first claw portions 74 and the ring frame supporting portion 30 of the first work unit supporting unit 26 when the ring frame supporting portion 30 is raised. Further, the predetermined height position is a height position that allows the holding unit 90 to hold the combined body including the second ring frame 13 supported by the second ring frame supporting unit 72.

The holding unit 90 holding the combined body including the wafer 1 reaches a position above the peeling unit 108. The peeling unit 108 will next be described. The peeling unit 108 peels off the first adhesive tape 7 from the wafer 1 and peels off the first adhesive tape 7 from the first ring frame 9 in a state in which the holding unit 90 holds the wafer 1. FIG. 8 includes a perspective view schematically illustrating the peeling unit 108. In addition, FIG. 10A, FIG. 10B, and FIG. 11 include side views schematically illustrating the peeling unit 108.

The peeling unit 108 includes a peeling tape supply unit 110 to which a peeling tape 114 formed by a base material and an adhesive layer formed on one surface of the base material is drawably fitted in a state of being rolled in a roll shape, and a winding unit 126 that winds and collects the peeling tape 114. The peeling unit 108 further includes a plurality of rollers 116 that guide the peeling tape 114 drawn out from the peeling tape supply unit 110 and form a traveling path of the peeling tape 114.

The peeling tape supply unit 110 includes a feeding roller 112 fitted with a roll of unused peeling tape 114 and a rotational driving source (not illustrated) that rotates the feeding roller 112. In addition, the winding unit 126 includes a winding roller 128 around which the peeling tape 114 already used is wound to form a roll and a rotational driving source (not illustrated) that rotates the winding roller 128.

In addition, the peeling unit 108 includes a moving body 118 on which a part of the plurality of rollers 116 forming the traveling path of the peeling tape 114 are arranged and a driving unit 124 that moves the moving body 118. The driving unit 124 has a rail 120 along the X-axis direction. The moving body 118 is fitted to the rail 120 in such a manner as to be slidable along the X-axis direction. The driving unit 124 has a driving source (not illustrated) that moves the moving body 118 along the rail 120.

The peeling tape 114 externally supplied to the moving body 118 travels on the traveling path while guided by the rollers 116, and travels to the outside of the moving body 118. The feeding roller 112 and the winding roller 128 are rotated as appropriate in such a manner as not to produce a slack in the peeling tape 114 and in such a manner as not to apply an excessive tensile force to the peeling tape 114 when the moving body 118 is moved. The length of the peeling tape 114 traveling on the traveling path is thereby adjusted.

Further, the peeling unit 108 includes, in the moving body 118, a pressing portion 122 that pushes up the peeling tape 114 traveling on the traveling path. The pressing portion 122 is movable along the X-axis direction together with the moving body 118, and is raisable and lowerable along the Z-axis direction with respect to the moving body 118. When the pressing portion 122 is raised along the Z-axis direction, the peeling tape 114 is pressed against the first adhesive tape 7 of the combined body that includes the wafer 1 and that is held by the holding unit 90, and the peeling tape 114 is thereby affixed to the first adhesive tape 7.

Figure 10A:
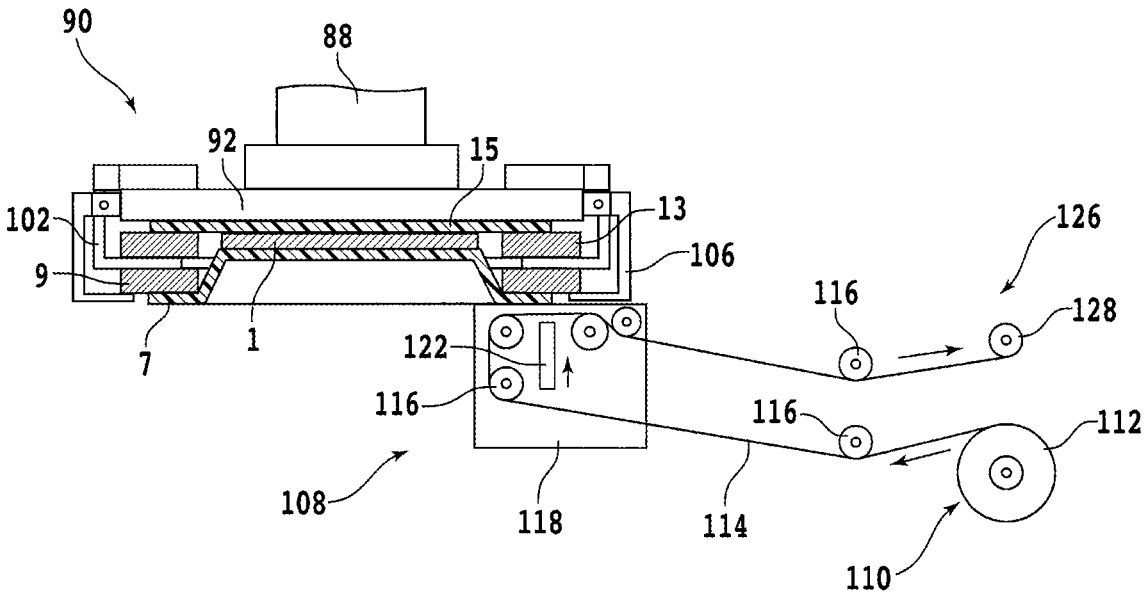
FIG. 10A is a sectional view schematically illustrating an initial stage of a peeling step.

Description will next be made of a process of peeling off the first adhesive tape 7 by the peeling unit 108. First, the moving body 118 is moved to a position below the holding unit 90 that holds the combined body including the wafer 1. At this time, the position of the moving body 118 is adjusted such that the pressing portion 122 is positioned below an end portion of the first adhesive tape 7. FIG. 10A is a sectional view schematically illustrating the combined body in this state. Then, the pressing portion 122 is raised to press and affix the peeling tape 114 to the end portion of the first adhesive tape 7. Thereafter, the peeling tape 114 is moved by moving the moving body 118 by the driving unit 124, and the first adhesive tape 7 is pulled by the peeling tape 114. At this time, the feeding roller 112 and the winding roller 128 are rotated or stopped as appropriate. Then, the first adhesive tape 7 is peeled off from one end of the first ring frame 9.

Figure 10B:
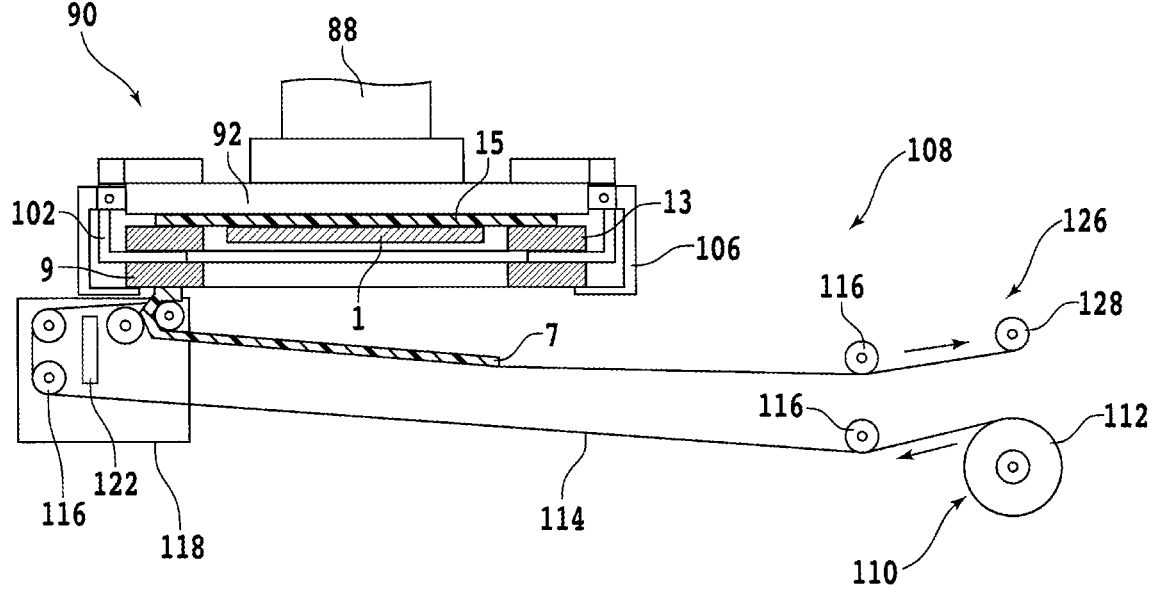
FIG. 10B is a sectional view schematically illustrating an ending stage of the peeling step.

Then, when the moving body 118 is further moved while the winding roller 128 winds the peeling tape 114, the first adhesive tape 7 starts to be peeled off also from the wafer 1 while the peeling of the first adhesive tape 7 from the first ring frame 9 progresses. When the movement of the moving body 118 is further continued, the first adhesive tape 7 is ultimately peeled off completely from the wafer 1 and the first ring frame 9. FIG. 10B is a sectional view schematically illustrating the wafer 1 and the like immediately before completion of the peeling of the first adhesive tape 7.

Figure 11:
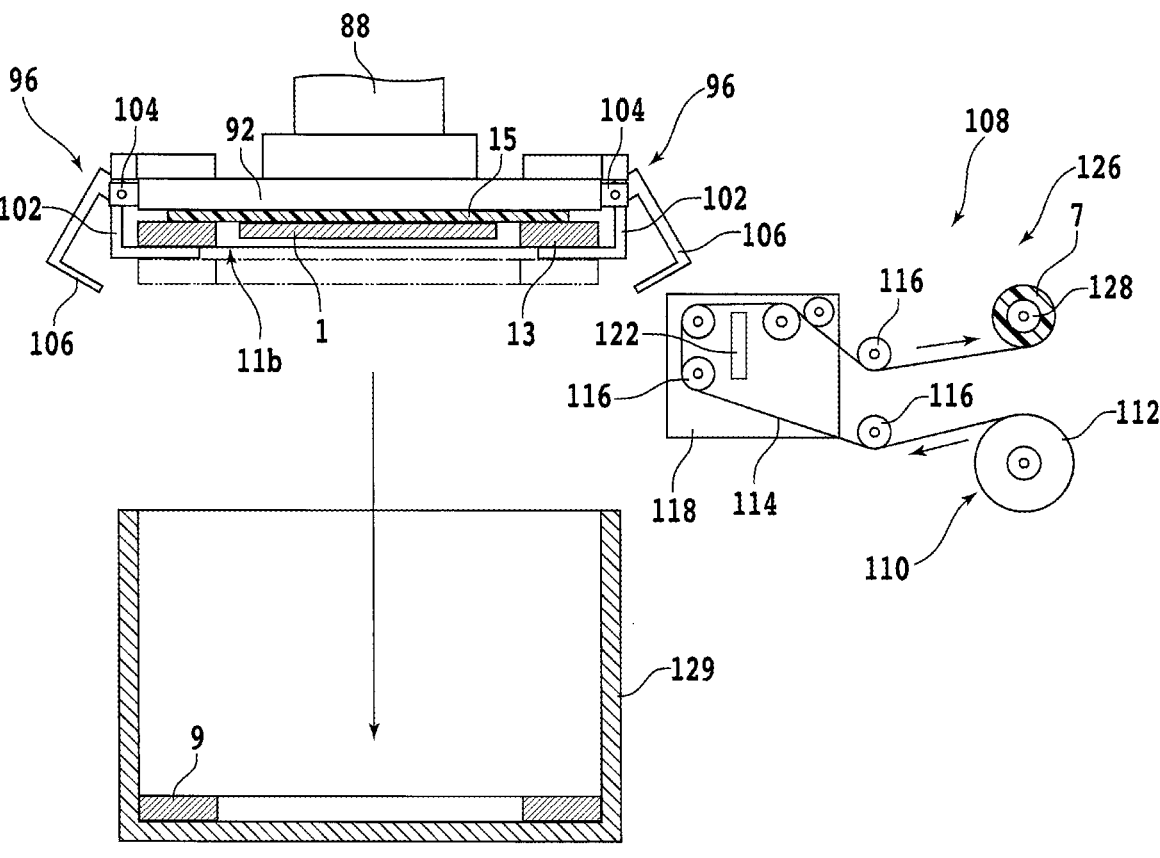
FIG. 11 is a sectional view schematically illustrating a manner in which a first ring frame is collected.

Incidentally, when the winding roller 128 is further rotated, the peeling tape 114 to which the first adhesive tape 7 is affixed can be wound and collected by the winding unit 126. FIG. 11 schematically illustrates the first adhesive tape 7 collected by the winding unit 126. In this state, the disintegration of the first work unit 11*a* is completed.

In addition, in a case where the holding unit 90 includes a heating mechanism, the wafer 1 may be heated to a predetermined temperature by actuating the heating mechanism when the first adhesive tape 7 is peeled off from the wafer 1. When the heating mechanism is actuated, the first adhesive tape 7 is also heated and softened in a region in which the first adhesive tape 7 is affixed to the wafer 1. It is therefore easy to peel off the first adhesive tape 7 from the wafer 1 even in a case where the first adhesive tape 7 is deformed in such a manner as to follow the uneven shape of the top surface 1*a* of the wafer 1 and thus firmly adheres to the top surface 1*a*.

When the first work unit 11*a* is disintegrated by the peeling unit 108 and the wafer 1 is thereby separated from the first ring frame 9, a second work unit 11*b* including the wafer 1, the second adhesive tape 15, and the second ring frame 13 is formed. That is, the transfer of the wafer 1 from the first adhesive tape 7 to the second adhesive tape 15 is performed. At this time, the second ring frame 13 is supported by the second claw portions 102, and the wafer 1 continues to be held under suction by the suction holding unit 92 via the second adhesive tape 15. That is, the holding unit 90 holds the second work unit 11*b*. Then, the first ring frame 9 separated from the wafer 1 and the like is supported by the third claw portions 106. Next, the first ring frame 9 is collected.

FIG. 11 is a sectional view schematically illustrating a manner in which the first ring frame 9 is collected. FIG. 11 schematically illustrates a collecting container 129 provided below the holding unit 90. The collecting container 129 is formed in such a size as to be able to house the first ring frame 9, and an upper part of the collecting container 129 is opened. The collecting container 129 houses and collects the separated first ring frame 9. When the first ring frame 9 is collected into the collecting container 129, the moving body 118 of the peeling unit 108 is retreated from a region below the holding unit 90. Incidentally, in FIG. 11, for the convenience of description, a side view of the second claw portions 102 of the holding unit 90 and a side view of the third claw portions 106 of the holding unit 90 are illustrated superimposed on each other. However, the holding unit 90 may have a claw portion mechanism obtained by integrating the second claw portions 102 and the third claw portions 106 and elements accompanying these claw portions, as illustrated in FIG. 11. Then, the second claw portions 102 and the third claw portions 106 may both act on specific parts at the outer edge of the combined object including the wafer 1. That is, the positions of the second claw portions 102 and the third claw portions 106 in the XY plane are not limited to any position as long as the respective supporting target objects can be supported.

When the first ring frame 9 is collected, only the holding of the first ring frame 9 by the third claw portions 106 is released by actuating the third claw portion opening and closing units 96 while the holding of the wafer 1 and the second ring frame 13 by the holding unit 90 is continued. Then, the first ring frame 9 loses support, and falls into the collecting container 129. First ring frames 9 are collected into the collecting container 129 one after another. The collected first ring frames 9 are unloaded from the wafer transfer apparatus 2, and are reused for the formation of work units after being subjected to a predetermined cleaning process.

After the first ring frame 9 and the first adhesive tape 7 are separated from the wafer 1, the second work unit 11*b* is cleaned before being unloaded from the wafer transfer apparatus 2. Description will next be made of a cleaning unit 166 that cleans the second work unit 11*b* and a transporting mechanism that transports the second work unit 11*b* to the cleaning unit 166.

Figure 12:
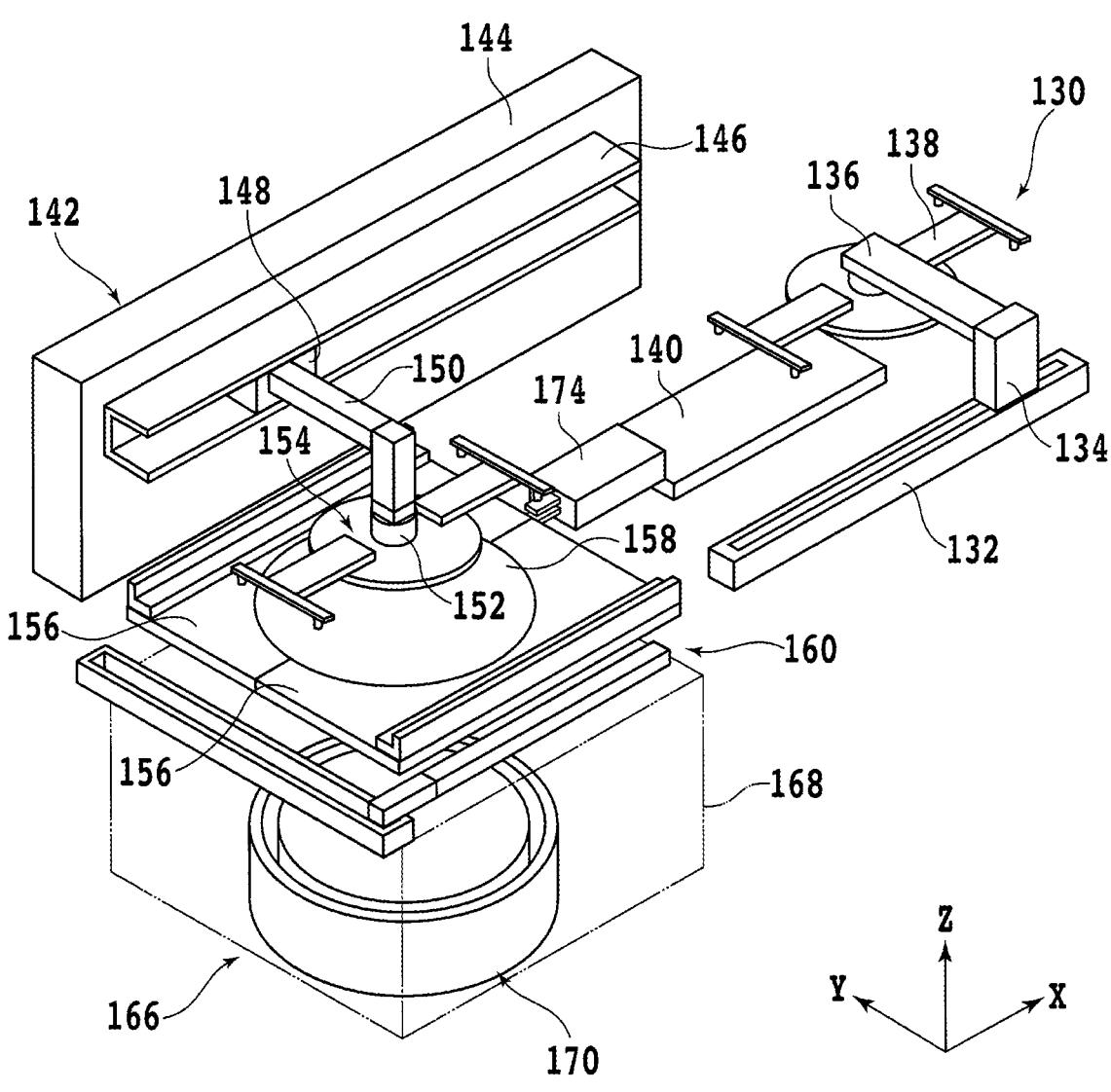
FIG. 12 is a perspective view schematically illustrating an inverting unit, a transfer table, a second work unit transporting unit, guide rail tables, a second UV irradiating unit, a cleaning unit, and a push-pull arm.

FIG. 12 schematically illustrates an inverting unit 130 that receives the second work unit 11*b* from the holding unit 90 and vertically inverts the second work unit 11*b* and a transfer table 140 on which the second work unit 11*b* is temporarily placed. The inverting unit 130 includes a rail 132 along the X-axis direction, a moving body 134 slidably fitted to the rail 132, a rotary arm unit 136 extending from the moving body 134 along the Y-axis direction, and a holding unit 138 fixed to a distal end of the rotary arm unit 136. A proximal end side of the rotary arm unit 136 is raisably and lowerably and rotatably connected to the moving body 134. The orientation of the holding unit 138 is changed when the rotary arm unit 136 is rotated. The holding unit 138 is connected to an unillustrated suction mechanism. The holding unit 138 has a function of coming into contact with the top surface 13*a* side of the second ring frame 13 of the second work unit 11*b* and holding the second ring frame 13 under suction.

When the second work unit 11*b* is to be vertically inverted by the inverting unit 130, first, the holding unit 138 is vertically inverted by rotating the rotary arm unit 136. Then, the holding unit 138 is moved to a position below the holding unit 90, and the holding unit 138 is brought into contact with the top surface 13*a* side of the second ring frame 13 by raising the holding unit 138. Next, the suction holding of the second ring frame 13 by the holding unit 138 is started. Thereafter, the suction holding of the wafer 1 by the suction holding unit 92 of the holding unit 90 is released, and the second claw portions 102 are moved by actuating the second claw portion moving units 94, so that the support of the second ring frame 13 is released. Then, the second work unit 11*b* is in a state of being held by the holding unit 138 of the inverting unit 130. Thereafter, the orientation of the second work unit 11*b* is changed by rotating the rotary arm unit 136 by 180° while moving the moving body 134 in the X-axis direction. At this time, the top surface 13*a* of the second ring frame 13 of the second work unit 11*b* is oriented upward, and the undersurface 13*b* of the second ring frame 13 of the second work unit 11*b* is oriented downward. Then, the holding unit 138 is moved onto the transfer table 140, and the suction holding of the second ring frame 13 by the holding unit 138 is released. Then, the second work unit 11*b* is placed on the transfer table 140.

The wafer transfer apparatus 2 includes a pair of guide rail tables 156 on which the second work unit 11*b* is mounted and a second work unit transporting unit 142 that transports the second work unit 11*b* from the transfer table 140 to the guide rail tables 156. The second work unit transporting unit 142 includes a rail 146 along the X-axis direction, a supporting portion 144 that supports the rail 146, a moving body 148 slidably fitted to the rail 146, and an unillustrated driving source that moves the moving body 148 along the rail 146.

The moving body 148 is connected with a proximal end portion of an arm portion 150 extending along the Y-axis direction. A distal end portion of the arm portion 150 is connected with a holding unit 154 via a shaft-shaped raising and lowering unit 152 extensible and contractible along the Z-axis direction. The holding unit 154 is connected to an unillustrated suction mechanism. The holding unit 154 thereby has a function of suction holding the second ring frame 13 of the second work unit 11*b*.

The pair of guide rail tables 156 have a function of being able to support the second work unit 11*b*, and can approach or separate from each other along the Y-axis direction. A vertically penetrating circular opening portion 158 is formed in a central portion of the whole of the pair of guide rail tables 156. The diameter of the opening portion 158 is larger than the diameter of the wafer 1.

Disposed below the pair of guide rail tables 156 is a second UV irradiating unit 160 that can irradiate the second work unit 11*b* supported by the pair of guide rail tables 156 with UV rays from below through the opening portion 158. In addition, the cleaning unit 166 that cleans the second work unit 11*b* is disposed below the second UV irradiating unit 160.

Figure 13:
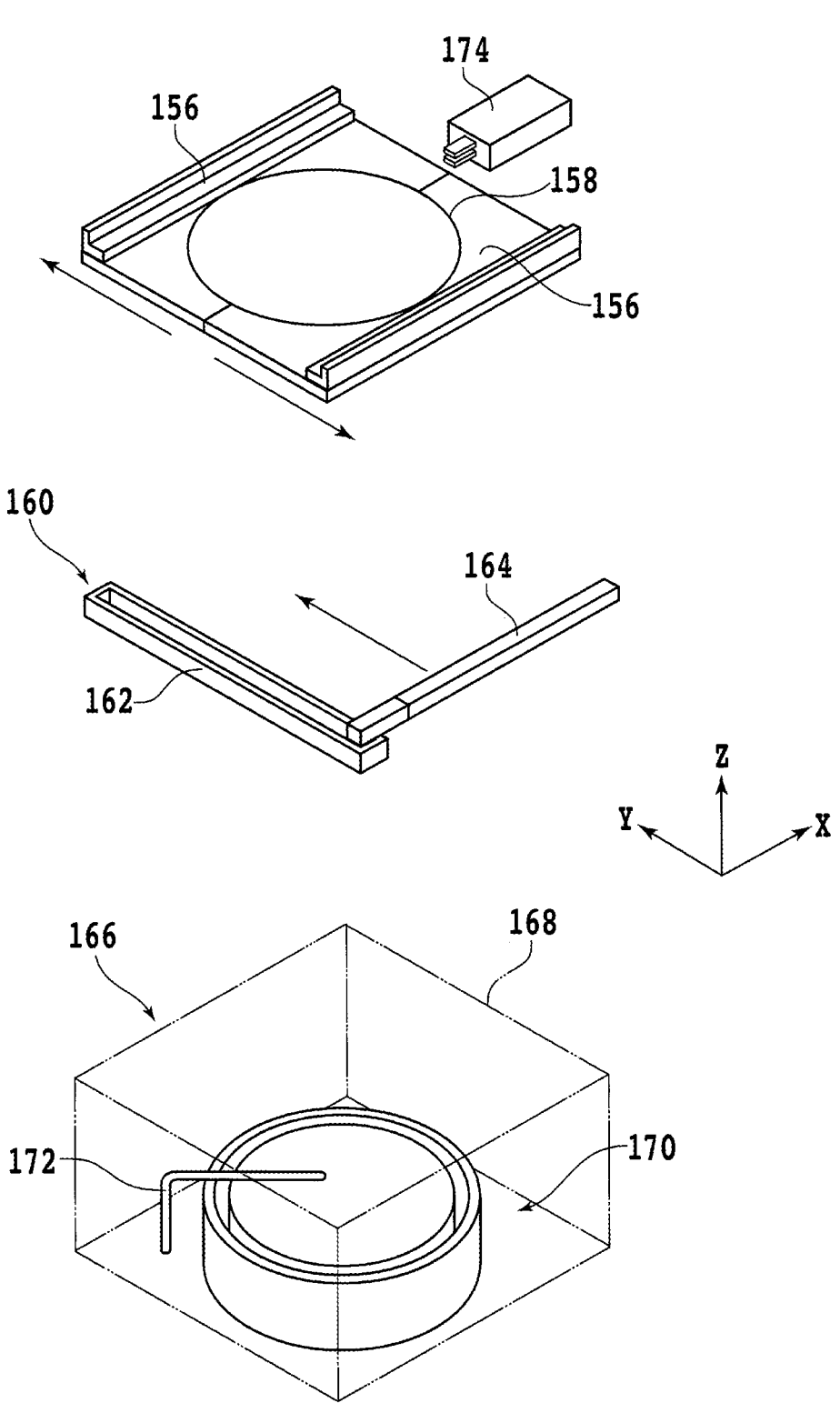
FIG. 13 is a perspective view schematically illustrating the guide rail tables, the push-pull arm, the second UV irradiating unit, and the cleaning unit in a state of being separated from one another.

FIG. 13 is a perspective view schematically illustrating the pair of guide rail tables 156, the second UV irradiating unit 160, and the cleaning unit 166 in a state of being separated from each other along a vertical direction for the convenience of description. The cleaning unit 166 includes a cleaning chamber 168, a holding table 170 provided on the floor surface of the cleaning chamber 168, and a cleaning nozzle 172 that can supply liquid to the upper surface of the second work unit 11*b* mounted on the holding table 170. The cleaning unit 166 cleans, with the liquid, the wafer 1 from which the first adhesive tape 7 has been peeled off by the peeling unit 108.

The holding table 170 includes an unillustrated suction mechanism. The holding table 170 thereby has a function of suction holding the second work unit 11*b* from below. In addition, a clamp mechanism (not illustrated) that grips the second ring frame 13 from a peripheral side may be provided to the peripheral side of the holding table 170. In addition, the holding table 170 is rotatable about a rotational axis that penetrates the center of the upper surface of the holding table 170 in the Z-axis direction.

The cleaning nozzle 172 is a pipe-shaped member that includes a shaft portion erected along the Z-axis direction on the outside of the holding table 170 and an arm portion extending from a distal end of the shaft portion along the horizontal direction (direction within the XY plane). An unillustrated liquid supply source and an unillustrated rotational driving source are connected to a lower end of the shaft portion of the cleaning nozzle 172. A distal end of the arm portion forms a liquid jetting port. Liquid jetted from the cleaning nozzle 172 and used for the cleaning is pure water, for example. Incidentally, high pressure air may be mixed in the liquid used for the cleaning, and the mixed fluid may be jetted from the cleaning nozzle 172. In addition, the cleaning nozzle 172 is retreated from above the holding table 170 by being rotated about the shaft portion, in such a manner as not to obstruct the movement of the second work unit 11*b* at times of loading and unloading the second work unit 11*b* onto and from the holding table 170. Conversely, at a time of jetting the liquid, the jetting port of the distal end is positioned above the holding table 170.

In the cleaning unit 166, the liquid is jetted from the cleaning nozzle 172 to the second work unit 11*b* while the holding table 170 holding the second work unit 11*b* is rotated. Then, the second work unit 11*b* is cleaned by the liquid. Thereafter, the second work unit 11*b* can be dried when the rotation of the holding table 170 is continued while the jetting of the liquid from the cleaning nozzle 172 is stopped.

When the second work unit 11*b* temporarily placed on the transfer table 140 is to be cleaned, the second work unit 11*b* is held by the holding unit 154 of the second work unit transporting unit 142, and the holding unit 154 is moved to a position above the guide rail tables 156. At this time, the pair of guide rail tables 156 are separated from each other in advance to allow the second work unit 11*b* to be raised or lowered therebetween. Thereafter, the holding unit 154 is lowered, the second work unit 11*b* is mounted onto the holding table 170 of the cleaning unit 166, and the holding of the second work unit 11*b* by the holding unit 154 is released. Then, the second work unit 11*b* is held by the holding table 170, and the second work unit 11*b* is cleaned and dried. Thereafter, the second work unit 11*b* is held by the holding unit 154 of the second work unit transporting unit 142, and the holding of the second work unit 11*b* by the holding table 170 is released.

Next, the second work unit 11*b* is lifted by raising the holding unit 154, and the pair of guide rail tables 156 are moved in such a manner as to approach each other. Thereafter, the second work unit 11*b* is mounted onto the pair of guide rail tables 156, and the holding of the second work unit 11*b* by the holding unit 154 is released. Next, the second UV irradiating unit 160 irradiates the second work unit 11*b* with UV rays from below. FIG. 13 includes a perspective view schematically illustrating the second UV irradiating unit 160. The second UV irradiating unit 160 includes a rail 162 along the Y-axis direction and a UV light source unit 164 slidably connected to the rail 162. The UV light source unit 164 includes a plurality of UV light sources arranged on the upper surface of a support along the X-axis direction in such a manner as to be oriented upward. The UV light sources are, for example, UV light emitting diodes (LEDs) or the like.

The second UV irradiating unit 160 includes an unillustrated driving source that moves the UV light source unit 164 along the rail 162. When the UV light source unit 164 is moved along the rail 162 while the UV light sources of the UV light source unit 164 are operated to apply UV rays upward, the second work unit 11*b* is irradiated with the UV rays from below through the opening portion 158. When the second adhesive tape 15 of the second work unit 11*b* is irradiated with the UV rays, the second adhesive tape 15 is cured, and the force of adhesion of the second adhesive tape 15 to the wafer 1 is decreased. In this case, it becomes easy to peel off the wafer 1 from the second adhesive tape 15 on the outside of the wafer transfer apparatus 2. For example, it becomes easy to pick up individual device chips formed by dividing the wafer 1.

Finally, the second work unit 11*b* placed on the pair of guide rail tables 156 is housed into the cassette 8*b* mounted on the cassette table 6*b*. The wafer transfer apparatus 2 includes, at a position adjacent to the pair of guide rail tables 156, a push-pull arm (loading unit) 174 that can move the second work unit 11*b* along the X-axis direction while gripping the second ring frame 13 of the second work unit 11*b*. The push-pull arm 174 is used to load the second work unit 11*b* into the cassette 8*b*.

The push-pull arm 174 is configured in a manner similar to that of the push-pull arm 10 described with reference to FIG. 3 and the like. When the second work unit 11*b* is to be housed into the cassette 8*b*, the position of the second work unit 11*b* in the Y-axis direction is adjusted in advance by sandwiching the second ring frame 13 between erected portions of the pair of guide rail tables 156 along the Y-axis direction in advance. Next, the push-pull arm 174 is moved along the X-axis direction, and the push-pull arm 174 thereby pushes the second work unit 11*b* into the cassette 8*b*. At this time, the height of the second work unit 11*b* and the height of a housing region in the cassette 8*b* are made to coincide with each other in advance by adjusting the height of the cassette table 6*b*. Then, the second work unit 11*b* is moved to the predetermined housing region, and the housing of the second work unit 11*b* into the cassette 8*b* is completed.

With the configuration described above, the wafer transfer apparatus 2 transfers the wafer 1 affixed to the first adhesive tape 7 to the second adhesive tape 15, and forms the second work unit 11*b*. The wafer transfer apparatus 2 can perform the transfer work without cutting the first adhesive tape 7 on the periphery of the wafer 1. Therefore, there is neither a fear that the cutting tool cutting the first adhesive tape 7 may collide with the wafer 1 nor a fear that cutting waste produced by the cutting may adhere to the wafer 1 and contaminate the devices 5 or the like.

Figure 14:
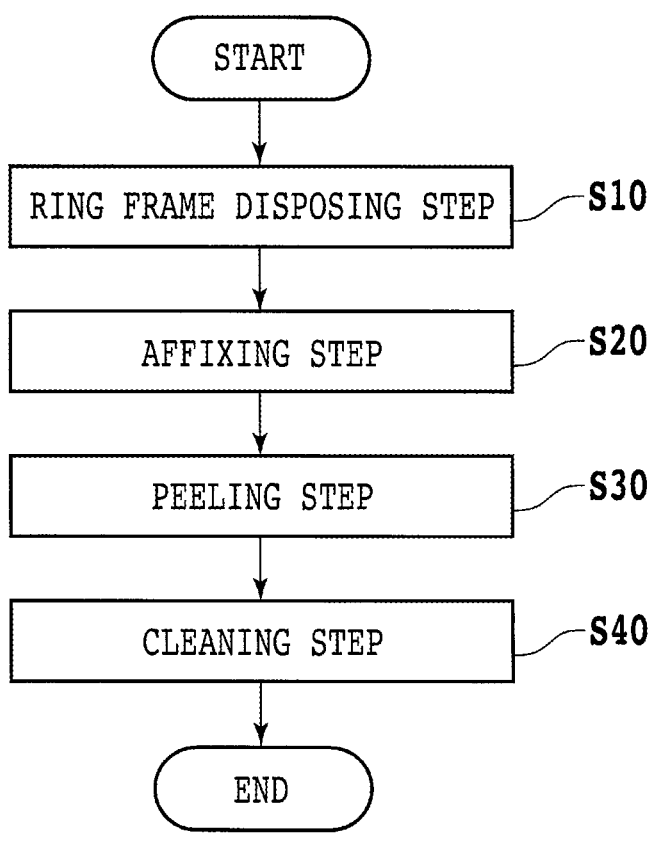
FIG. 14 is a flowchart illustrating a flow of steps of a wafer transfer method.

Next, description will be made of the wafer transfer method according to the present embodiment which method uses the wafer transfer apparatus 2, and a usage method of the wafer transfer apparatus 2 will thereby be summarized. FIG. 14 is a flowchart illustrating a flow of steps of the wafer transfer method. The wafer transfer method to be described in the following is a method of transferring the wafer 1 of the first work unit 11*a* including the first ring frame 9, the first adhesive tape 7, and the wafer 1 to the second adhesive tape 15 affixed to the second ring frame 13. The second work unit 11*b* is thereby formed.

First, performed is a ring frame disposing step S10 which superposes the second ring frame 13 on the first ring frame 9 of the first work unit 11*a* without bringing the second ring frame 13 into contact with the first ring frame 9. In the ring frame disposing step S10, as illustrated in FIG. 6B, the first work unit 11*a* is transported onto the first work unit supporting unit 26. Then, the adhesive tape supply unit 50 (see FIG. 4) affixes the second adhesive tape 15 to the undersurface 13*b* side of the second ring frame 13 in such a manner as to close the second opening portion 13*c*. Thereafter, the second ring frame 13 is mounted on the first claw portions (claw bodies) 74 of the second ring frame supporting unit 72.

At this time, the second ring frame 13 is faced to a surface of the first ring frame 9 of the first work unit 11*a* which surface is not affixed to the first adhesive tape 7, while the second opening portion 13*c* of the second ring frame 13 is superposed on the first opening portion 9*c* of the first ring frame 9. That is, the top surface 13*a* of the second ring frame 13 is faced to the top surface 9*a* of the first ring frame 9. Next, the wafer supporting portion 28 and the ring frame supporting portion 30 of the first work unit supporting unit 26 supporting the first work unit 11*a* are raised, and the first ring frame 9 is brought into contact with the undersurfaces of the first claw portions (claw bodies) 74. Then, the first claw portions (claw bodies) 74 are set in a state of being sandwiched between the first ring frame 9 and the second ring frame 13. Thus, the second ring frame 13 is superposed on the first ring frame 9 without being in contact with the first ring frame 9.

Incidentally, sandwiching the first claw portions (claw bodies) 74 between the first ring frame 9 and the second ring frame 13 refers to a state in which the first claw portions (claw bodies) 74 are positioned between the first ring frame 9 and the second ring frame 13 while in contact with both the first ring frame 9 and the second ring frame 13. This refers to a state in which the first claw portions (claw bodies) 74 function as a spacer for forming a predetermined interval between the two ring frames, and it is unnecessary to apply a force for bringing the two ring frames close to each other between the two ring frames. That is, the two ring frames and the first claw portions (claw bodies) 74 do not need to be sandwiched by a mechanism having a sandwiching function, such as clips or clamps. A force that brings the first ring frame 9 into contact with the first claw portions (claw bodies) 74 and a force that brings the second ring frame 13 into contact with the first claw portions (claw bodies) 74 may be different kinds of forces.

An affixing step S20 is performed following the ring frame disposing step S10. In the affixing step S20, the second adhesive tape 15 is affixed to a surface (undersurface 1*b*) of the wafer 1 which surface is not affixed to the first adhesive tape 7 in a state in which the first ring frame 9 and the second ring frame 13 are superposed on each other without being in contact with each other. The wafer 1 held by the first ring frame 9 via the first adhesive tape 7 is thereby held by the second ring frame 13 via the second adhesive tape 15. FIG. 7 is a sectional view schematically illustrating the affixing step S20. The affixing step S20 is performed by the roller 78 of the tape affixing unit 76. In a case where the second adhesive tape 15 is affixed to the second ring frame 13 in advance, the second adhesive tape 15 is affixed to the wafer 1 by rolling the roller 78 while pressing the second adhesive tape 15 from above by the roller 78 in a region superposed on the wafer 1.

Incidentally, the wafer transfer method according to the present embodiment provides a predetermined interval between the first ring frame 9 and the second ring frame 13 by sandwiching the first claw portions (claw bodies) 74 between the first ring frame 9 and the second ring frame 13. Therefore, such a problem that the second adhesive tape 15 hangs down, comes into contact with the first adhesive tape 7, and is affixed to the first adhesive tape 7, for example, does not occur easily. When the two adhesive tapes are affixed to each other, it is not easy to peel off these adhesive tapes from each other, and there is also a fear that an excessive force may be applied to the wafer 1 and damage the wafer 1 in a process of peeling off the two adhesive tapes from each other. When a predetermined interval is provided between the two adhesive tapes by use of the first claw portions (claw bodies) 74, the second adhesive tape 15 hanging down does not easily come into contact with the first adhesive tape 7, so that the problem does not occur easily.

Here, when the wafer 1 is affixed to the second adhesive tape 15 in the affixing step S20, relative positions of the wafer 1 and the first ring frame 9 in a penetrating direction of the first opening portion 9*c* are preferably adjusted in advance. For example, the wafer supporting portion 28 of the first work unit supporting unit 26 is raised relative to the ring frame supporting portion 30, and the upper surface of the wafer supporting portion 28 is thereby positioned at a height position higher than the upper surface of the ring frame supporting portion 30. In this case, as illustrated in FIG. 7, the first adhesive tape 7 is deformed, and the first adhesive tape 7 partially enters the first opening portion 9*c* of the first ring frame 9. At this time, the undersurface 1*b* of the wafer 1 is brought close to the second adhesive tape 15 as compared with a case where the upper surfaces of the wafer supporting portion 28 and the ring frame supporting portion 30 are at the same height, that is, as compared with a case where the first adhesive tape 7 is not deformed. It is therefore possible to bring the second adhesive tape 15 into contact with the undersurface 1*b* of the wafer 1 without deeply advancing the roller 78 into the second opening portion 13*c* of the second ring frame 13, that is, without forcibly pushing down the second adhesive tape 15. Thus, damage or irreversible elongation does not occur easily in the second adhesive tape 15.

When the affixing step S20 is performed, formed is a combined body in which the first ring frame 9, the first adhesive tape 7, the wafer 1, the second adhesive tape 15, and the second ring frame 13 are integrated. The wafer transfer method according to the present embodiment next performs a peeling step S30 of peeling off the first adhesive tape 7 from the wafer 1 and peeling off the first adhesive tape 7 from the first ring frame 9. The peeling step S30 is performed in a state in which the first ring frame 9 and the second ring frame 13 are superposed on each other without being in contact with each other. FIG. 10A is a sectional view schematically illustrating the combined body when the peeling step S30 is performed. FIG. 10B is a sectional view schematically illustrating the wafer 1 from which the first adhesive tape 7 is peeled off in the peeling step S30 and the like. The peeling step S30 is, for example, performed by the peeling unit 108 of the wafer transfer apparatus 2.

In the peeling step S30, the combined body including the wafer 1 is held by the holding unit 90, and the moving body 118 of the peeling unit 108 is moved to a position below the holding unit 90. Thereafter, the peeling tape 114 is pushed up by raising the pressing portion 122 of the peeling unit 108, and the peeling tape 114 is thereby affixed to one end of the first adhesive tape 7. Next, the peeling tape 114 is moved by moving the moving body 118. Consequently, the first adhesive tape 7 is pulled by the peeling tape 114, and the first adhesive tape 7 is peeled off from the first ring frame 9 and the wafer 1. When the first adhesive tape 7 is peeled off from the first ring frame 9 and the wafer 1, the second work unit 11*b* (FIG. 11) formed by the wafer 1, the second adhesive tape 15, and the second ring frame 13 remains in the holding unit 90. The transfer of the wafer 1 from the first adhesive tape 7 to the second adhesive tape 15 is thereby completed.

After the peeling step S30 is performed, a cleaning step S40 of cleaning the wafer 1 with liquid may be further performed. The cleaning step S40 is performed by the cleaning unit 166 illustrated in FIG. 13 and the like. In the cleaning step S40, the second work unit 11b including the wafer 1 is transported to the cleaning unit 166. Then, the holding table 170 is made to hold the second work unit 11b. Next, liquid such as pure water is jetted from the cleaning nozzle 172 to the wafer 1 while the holding table 170 is rotated. The top surface 1a side of the wafer 1 to which side the first adhesive tape 7 was affixed can thereby be cleaned. Thereafter, the wafer 1 can be dried when the jetting of the liquid from the cleaning nozzle 172 is ended while the rotation of the holding table 170 is continued.

As described above, according to the wafer transfer method according to the present embodiment, the second adhesive tape 15 is affixed to the wafer 1 in a state in which the first claw portions (claw bodies) 74 are sandwiched between the first ring frame 9 and the second ring frame 13. Thereafter, the first adhesive tape 7 is peeled off from the wafer 1 and the like. Therefore, the first adhesive tape 7 can be removed from the wafer 1 without the first adhesive tape 7 being cut on the periphery of the wafer 1. Further, a problem of adhesion of the second adhesive tape 15 to the first adhesive tape 7 or the like does not occur easily. Hence, there is no fear of the cutting tool coming into contact with the wafer 1, nor does processing waste produced by the cutting of the first adhesive tape 7 adhere to the wafer 1. That is, the wafer 1 can be transferred safely by replacing the first adhesive tape 7 without cutting the first adhesive tape 7.

It is to be noted that the present invention is not limited to the description of the foregoing embodiment, and can be variously modified and carried out. For example, in the foregoing embodiment, description has been made of a case where, when the second adhesive tape 15 is affixed to the undersurface 1b of the wafer 1, the second ring frame 13 is disposed on the first claw portions (claw bodies) 74, the first ring frame 9 is disposed under the first claw portions (claw bodies) 74, and the first claw portions (claw bodies) 74 are sandwiched between the two ring frames. However, one aspect of the present invention is not limited to this. For example, the second adhesive tape 15 may be affixed to the wafer 1 while the first ring frame 9 is disposed on the first claw portions (claw bodies) 74, the second ring frame 13 is disposed under the first claw portions (claw bodies) 74, and the first claw portions (claw bodies) 74 are sandwiched between the two ring frames. That is, the affixing step S20 may be performed in a state in which each structure is vertically inverted.

In addition, description has been made of a case where, when the second adhesive tape 15 is affixed to the wafer 1, the second adhesive tape 15 is affixed to the second ring frame 13 by the adhesive tape supply unit 50 in advance. However, one aspect of the present invention is not limited to this. For example, the second adhesive tape 15 may be supplied to the undersurface 13b of the second ring frame 13 and the undersurface 1b of the wafer 1 at the same timing. In this case, the adhesive tape supply unit 50 is preferably disposed above the second ring frame supporting unit 72. Then, the first ring frame 9 of the first work unit 11a and the second ring frame 13 to which the second adhesive tape 15 is not affixed sandwich the first claw portions (claw bodies) 74. Thereafter, the second adhesive tape 15 is preferably supplied from the adhesive tape supply unit 50 to the wafer 1 and the second ring frame 13. In this case, the roller 78 of the tape affixing unit 76 preferably has a length exceeding the diameter of the second adhesive tape 15. Then, the undersurface 1b of the wafer 1 is preferably positioned at the same height position as the undersurface 13b of the second ring frame 13. Then, the roller 78 preferably increases a force of adhesion to the wafer 1 and increases a force of adhesion to the second ring frame 13 by pressing the second adhesive tape 15 from above.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer transfer method for forming a second work unit by transferring a wafer of a first work unit to a second adhesive tape that is affixed to a second ring frame in such a manner as to close a second opening portion disposed in a center of the second ring frame, the first work unit including a first ring frame having a first opening portion disposed in a center of the first ring frame, a first adhesive tape affixed to the first ring frame in such a manner as to close the first opening portion, and the wafer affixed to the first adhesive tape in the first opening portion of the first ring frame, the wafer transfer method comprising:

a ring frame disposing step of facing the second ring frame to a surface of the first ring frame of the first work unit, the first ring frame surface not being affixed to the first adhesive tape, while superposing the second opening portion on the first opening portion, and superposing the second ring frame on the first ring frame without bringing the second ring frame into contact with the first ring frame, by sandwiching a claw body between the first ring frame and the second ring frame;

an affixing step of affixing the second adhesive tape to a surface of the wafer, the wafer surface not being affixed to the first adhesive tape, in a state in which the first ring frame and the second ring frame are superposed on each other without being in contact with each other, and holding the wafer by the second ring frame via the second adhesive tape; and a peeling step of peeling off the first adhesive tape from the wafer and peeling off the first adhesive tape from the first ring frame in the state in which the first ring frame and the second ring frame are superposed on each other without being in contact with each other.

2. The wafer transfer method according to claim 1, wherein,
   in the affixing step, the second adhesive tape affixed to the second ring frame in advance is affixed to the wafer.

3. The wafer transfer method according to claim 1, further comprising:
   a cleaning step of cleaning the wafer with liquid after the peeling step.

4. The wafer transfer method according to claim 1, wherein,
   in the peeling step, a peeling tape is affixed to the first adhesive tape, and the first adhesive tape is peeled off from the first ring frame and the wafer by the peeling tape by moving the peeling tape.

5. The wafer transfer method according to claim 1, wherein,
   when the wafer is affixed to the second adhesive tape in the affixing step, the wafer is brought close to the second adhesive tape by adjusting relative positions of the wafer and the first ring frame in a penetrating direction of the first opening portion in advance while the first adhesive tape is deformed.

6. A wafer transfer apparatus for forming a second work unit by transferring a wafer of a first work unit to a second adhesive tape that is affixed to a second ring frame in such a manner as to close a second opening portion disposed in a center of the second ring frame, the first work unit including a first ring frame having a first opening portion disposed in a center of the first ring frame, a first adhesive tape affixed to the first ring frame in such a manner as to close the first opening portion, and the wafer affixed to the first adhesive tape in the first opening portion of the first ring frame, the wafer transfer apparatus comprising:

a first work unit supporting unit including a wafer supporting portion configured to support the wafer via the first adhesive tape and a ring frame supporting portion configured to support the first ring frame via the first adhesive tape, the first work unit supporting unit being configured to support the first work unit in a state in which a surface of the wafer, the wafer surface not being affixed to the first adhesive tape, is exposed upward;

a second ring frame supporting unit including a first claw portion having a function of supporting the second ring frame in such a manner as to face the first ring frame supported by the ring frame supporting portion of the first work unit supporting unit and a function of being sandwiched between the first ring frame and the second ring frame, the second ring frame supporting unit being configured to be able to move the first claw portion between a region between the first ring frame and the second ring frame and an outside of the region;

a tape affixing unit disposed above the second ring frame supporting unit, the tape affixing unit being configured to affix the second adhesive tape to a surface of the wafer supported by the wafer supporting portion of the first work unit supporting unit, the wafer surface not being affixed to the first adhesive tape;

a holding unit having a second claw portion, the holding unit being configured to hold the second ring frame by the second claw portion by inserting the second claw portion between the first ring frame and the second ring frame and hold the wafer via the second adhesive tape; and a peeling unit configured to peel off the first adhesive tape from the wafer and peel off the first adhesive tape from the first ring frame in a state in which the holding unit holds the wafer.

7. The wafer transfer apparatus according to claim 6, further comprising:

a tape supply unit configured to affix the second adhesive tape to the second ring frame in such a manner as to close the second opening portion in advance before the second ring frame supporting unit supports the second ring frame.

8. The wafer transfer apparatus according to claim 6, further comprising:

a cleaning unit configured to clean, with liquid, the wafer from which the first adhesive tape has been peeled off by the peeling unit.

9. The wafer transfer apparatus according to claim 6, whereinthe peeling unit includes a peeling tape supply unit to which a peeling tape formed by a base material and an adhesive layer formed on one surface of the base material is drawably fitted in a state of being rolled in a roll shape, a plurality of rollers configured to guide the peeling tape drawn out from the peeling tape supply unit and form a traveling path of the peeling tape, a moving body having a pressing portion configured to affix the peeling tape to the first adhesive tape by pressing the peeling tape against the first adhesive tape, a driving unit configured to move the moving body, and a winding unit configured to wind and collect the peeling tape, and the peeling unit affixes the peeling tape to the first adhesive tape by pressing the peeling tape against the first adhesive tape by the pressing portion, moves the peeling tape by moving the moving body by the driving unit, peels off the first adhesive tape from the first ring frame and the wafer by the peeling tape, and is able to wind and collect, by the winding unit, the peeling tape to which the first adhesive tape is affixed.

10. The wafer transfer apparatus according to claims 6, wherein the first work unit supporting unit further includes a raising and lowering unit configured to raise and lower the wafer supporting portion and the ring frame supporting portion relative to each other.

\* \* \* \* \*